(12) United States Patent
Hidaka

(10) Patent No.: US 8,111,406 B2
(45) Date of Patent: Feb. 7, 2012

(54) SURFACE POSITION DETECTING APPARATUS, SURFACE POSITION DETECTING METHOD, EXPOSURE APPARATUS, AND DEVICE MANUFACTURING METHOD

(75) Inventor: Yasuhiro Hidaka, Kumagaya (JP)

(73) Assignee: Nikon Corporation, Tokyo (JP)

(*) Notice: Subject to any disclaimer, the term of this patent is extended or adjusted under 35 U.S.C. 154(b) by 409 days.

(21) Appl. No.: 12/265,572

(22) Filed: Nov. 5, 2008

(65) Prior Publication Data

US 2009/0123879 A1 May 14, 2009

Related U.S. Application Data

(60) Provisional application No. 60/996,378, filed on Nov. 14, 2007.

(51) Int. Cl.
*G01B 11/14* (2006.01)
(52) U.S. Cl. ........................................ 356/614; 356/622
(58) Field of Classification Search .......... 356/614–624, 356/399–401, 445–448, 369–370, 27–28; 250/548, 559.3, 492.1–492.2, 237 R, 237 G, 250/231.16; 359/619; 341/13
See application file for complete search history.

(56) References Cited

U.S. PATENT DOCUMENTS

| 5,633,721 | A | 5/1997 | Mizutani |
| 6,610,975 | B2 * | 8/2003 | Ito et al. .................... 250/231.16 |
| 2004/0165169 | A1 | 8/2004 | Teunissen et al. |
| 2009/0116039 | A1 | 5/2009 | Hidaka |

FOREIGN PATENT DOCUMENTS

| EP | 0 502 583 A1 | 9/1992 |
| EP | 0 502 583 B1 | 9/1992 |
| JP | 2007-048819 | 2/2007 |
| WO | WO 99/49504 | 9/1999 |
| WO | WO 2006/007549 | 1/2006 |
| WO | WO 2007/007549 A1 | 1/2007 |
| WO | WO 2007/058151 A1 | 5/2007 |

* cited by examiner

*Primary Examiner* — Tri T Ton
(74) *Attorney, Agent, or Firm* — Finnegan, Henderson, Farabow, Garrett & Dunner, L.L.P.

(57) ABSTRACT

A surface position detecting apparatus which detects position information of a predetermined surface in an object, comprising a first optical system which projects light from an oblique direction to the predetermined surface; a second optical system which receive the light from the object; a detecting system which receives the light from the second optical system and which detects the position information of the predetermined surface in a direction intersecting the predetermined surface based on the light; and a phase difference imparting system which is arranged in an optical path of at least one of the first and second optical systems and which imparts a phase difference between different portions from each other of light traveling via a surface other than the predetermined surface in the object, in the light from the second optical system.

24 Claims, 11 Drawing Sheets

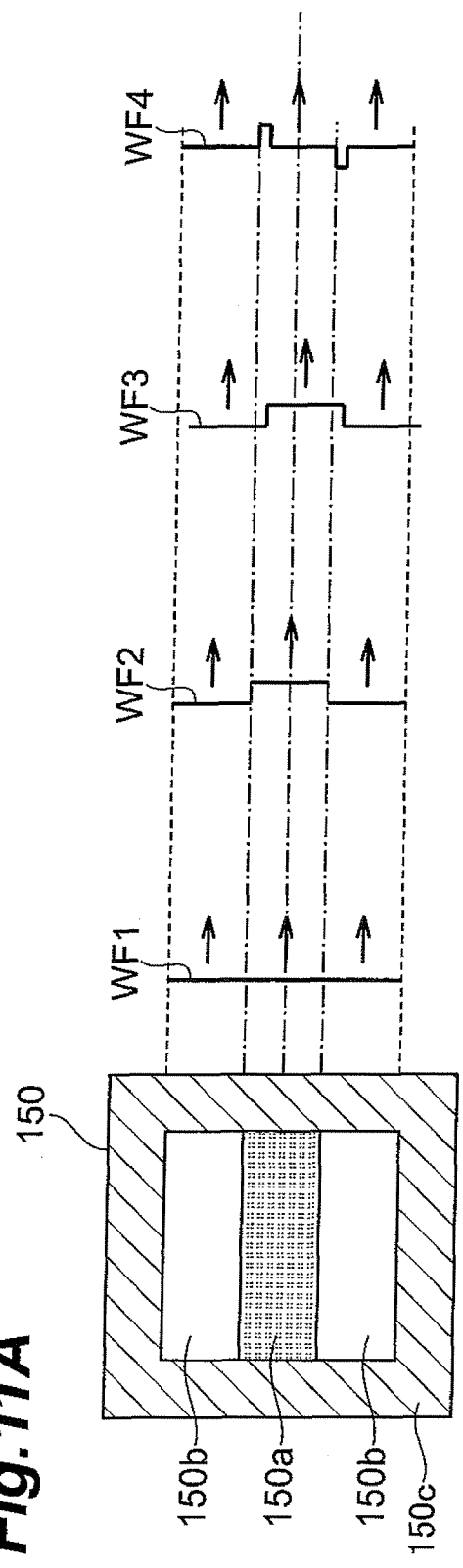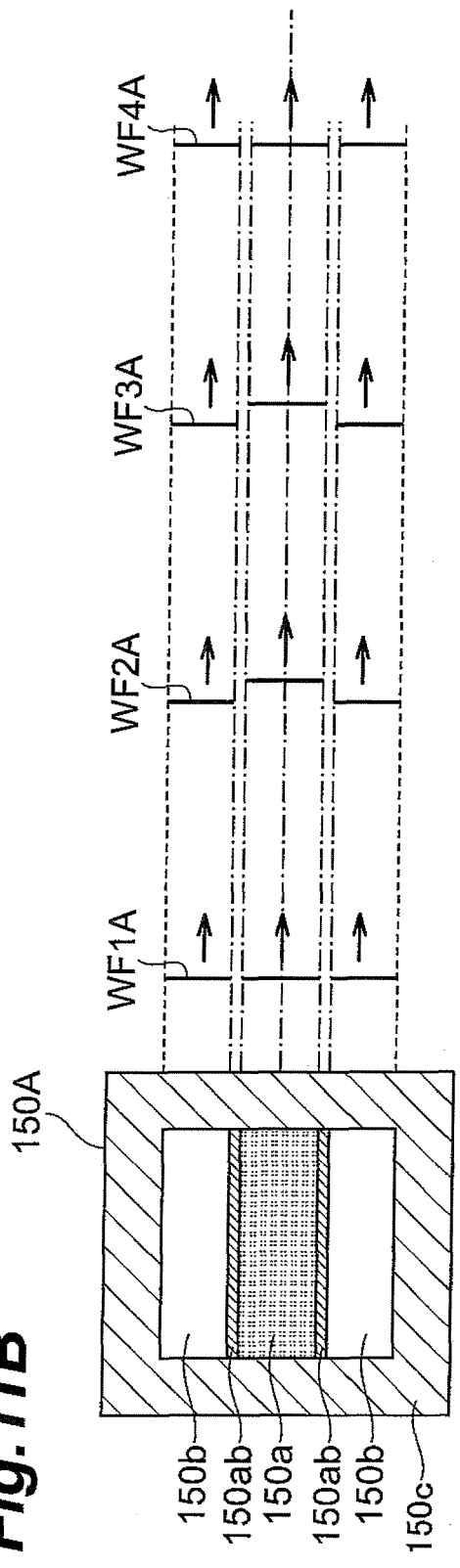

SURFACE POSITION DETECTING APPARATUS, SURFACE POSITION DETECTING METHOD, EXPOSURE APPARATUS, AND DEVICE MANUFACTURING METHOD

CROSS-REFERENCE TO RELATED APPLICATIONS

This application is based upon and claims the benefit of priorities from U.S. Provisional Application No. 60/996,378, filed on Nov. 14, 2007, the entire contents of which are incorporated herein by reference.

BACKGROUND OF THE INVENTION

1. Field

An embodiment of the present invention relates to a surface position detecting apparatus which detects surface position information of a predetermined surface in an object, an exposure apparatus incorporating this surface position detecting apparatus, a device manufacturing method for manufacturing such micro devices (electronic devices) as semiconductor devices or liquid-crystal display devices, using the exposure apparatus, and a surface position detecting method.

2. Description of the Related Art

A lithography process for manufacture of the semiconductor devices and others is carried out using an exposure apparatus for transferring a pattern formed on a reticle (mask), onto a wafer (or a glass plate or the like) having a surface coated with a resist (photosensitive material), through a projection optical system. The exposure apparatus in use is, for example, a reduction projection exposure apparatus of the step-and-repeat method (so called a stepper), or a scanning projection exposure apparatus of the step-and-scan method of synchronously scanning the reticle and the wafer (so called a scanning stepper).

As the semiconductor devices increase their integration degree and pattern fineness, the exposure apparatus is required to transfer the pattern in a high resolving power (high resolution). For this reason, in order to prevent image blurring or the like due to defocus, the exposure apparatus needs to perform exposure while keeping a wafer surface within a range of the depth of focus (DOF) of the image plane of the projection optical system (the best focus plane of the pattern). Therefore, the exposure apparatus is equipped with an autofocus sensor (hereinafter referred to as an AF sensor) to measure the position of the wafer surface (surface position) in the direction of the optical axis of the projection optical system, and is configured to control the height and inclination angle of a wafer stage on the basis of a measured value by this AF sensor.

The conventional AF sensor for the wafer surface is constructed with a sensor of an oblique incidence method configured to project a slit image or the like from an oblique direction to the wafer surface, measure a position of a position of the slit image or the like formed by light reflected on the wafer surface, and obtain the surface position information on the basis of the principle of triangulation from the measurement result (e.g., cf. U.S. Pat. No. 5,633,721).

SUMMARY

A circuit pattern or the like is normally formed through preceding steps on the wafer as a target to be measured by the conventional AF sensor, and a resist is further deposited thereon. In this case, the target to be measured by the AF sensor is a surface position of a surface of the resist. When measurement light is applied from the AF sensor onto the resist surface on the wafer, the measurement light divides into light reflected on the resist surface (light necessary for the measurement), and light entering the interior of the resist and reflected on the circuit pattern or the like formed on the substrate (light causing a measurement error).

Since these two types of light travel through much the same optical path, it is, however, difficult to remove only the light to cause the measurement error, by an ordinary stop or the like.

An embodiment of the present invention provides a surface position detecting technology permitting high-accuracy detection of the surface position information of the predetermined surface even if there is other surfaces in the object except for the detection target near the predetermined surface when a position information of the predetermined surface is detected, an exposure technology using this surface position detecting technology, and a device manufacturing method using this exposure technology.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A surface position detecting apparatus according to an embodiment of the present invention is a surface position detecting apparatus which detects position information of a predetermined surface in an object, comprising: a first optical system which projects light from an oblique direction to the predetermined surface; a second optical system which receives the light from the object; a detecting system which receives the light from the second optical system and which detects the position information of the predetermined surface in a direction intersecting the predetermined surface based on the light; and a phase difference imparting system which is arranged in an optical path of at least one of the first and second optical systems and which imparts a phase difference between different portions from each other of light traveling via a surface other than the predetermined surface in the object, in the light from the second optical system.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 11A is a drawing showing a relation of a first aperture stop 150 with wavefronts of light at respective positions in the AF sensor.

FIG. 11B is a drawing showing a relation of a first aperture stop 150A with wavefronts of light at respective positions in the AF sensor.

DESCRIPTION

First Embodiment

The present embodiment is an application of the present invention to an autofocus sensor (hereinafter referred to as an AF sensor) which is incorporated, for example, in an exposure apparatus and which detects surface position information of a surface of a resist (photosensitive material) applied onto a surface of a wafer.

Figure 8:
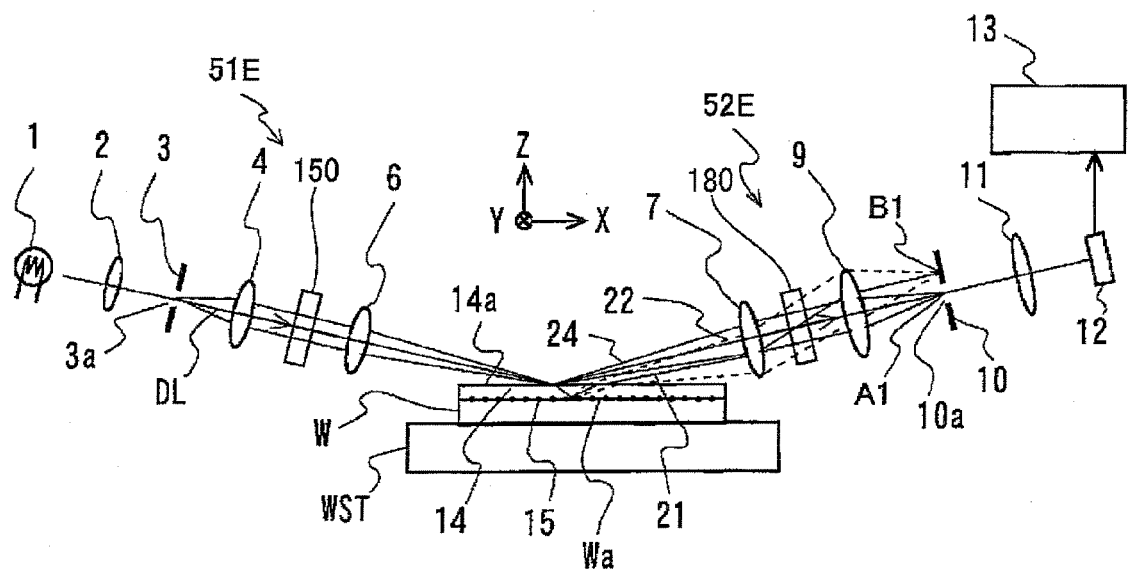
FIG. 8 is a drawing showing a configuration of an AF sensor in the first embodiment.

FIG. 8 shows the structure of the AF sensor of the present embodiment and in FIG. 8 a wafer W is held on a wafer stage WST by vacuum suction or the like through an unrepresented wafer holder. The wafer W is provided with a coating of a resist 14 in a thickness of about 100-300 nm, for example, on a surface of a substrate of a disk shape with the diameter of about 200-450 mm of a semiconductor (e.g., silicon), SOI (silicon on insulator), or the like. In FIG. 8 and other drawings, the resist 14 is depicted in a thickness much larger than its actual thickness, for convenience' sake of description. There are cases where an antireflection film or the like is further formed between the resist 14 and the wafer W. It is assumed that a pattern 15 such as a circuit pattern and alignment marks is formed in preceding steps, on an underlying surface Wa (a back surface of the resist 14) which is a surface of a substrate of the wafer W. The description hereinafter will be based on the coordinate system in which the Z-axis is taken along a direction of a normal to a guide surface (not shown) of the wafer stage WST nearly parallel to a mounting surface of the wafer W, the X-axis along a direction parallel to the plane of FIG. 8 in a plane perpendicular to the Z-axis, and the Y-axis along a direction normal to the plane of FIG. 8.

In the present embodiment, the pattern 15 on the underlying surface Wa is a pattern that can be regarded as isolated lines extending in the Y-direction, but it may also be a pattern that can be regarded as isolated lines extending in the X-direction, or a pattern periodic in the X- and Y-directions. There appears the first-order and higher-order diffracted light as well as specular reflection light (zeroth-order diffracted light) from the pattern 15, and the first-order and higher-order diffracted light will be simply called diffracted light. A surface (hereinafter referred to as a resist surface) 14a of the resist 14 as a surface (a target surface) to be detected a position information by AF sensor as a predetermined surface in an object constructed by the wafer W and the resist 14 is approximately perpendicular to the Z-axis (or approximately parallel to the XY plane), but the Z-directional position (Z-position or focus position) thereof differs depending upon positions in the X- and Y-directions because of variation in the thickness of the substrate of the wafer W, level differences of the underlying pattern, or the like.

The wafer stage WST is configured to drive the wafer W in the X- and Y-directions and to control the Z-position of the wafer W and angles of inclination thereof around the X-axis and the Y-axis so as to set an average plane of the resist surface 14a in an exposure region illuminated with illumination light (exposure light) for exposure, within a width of the depth of focus of a projection optical system with respect to a best focus plane BF (a target position of the target surface for alignment by the AF sensor) of a projection optical system (not shown), based on a distribution of Z-positions of the resist surface 14a as a surface position information measured by the AF sensor.

The AF sensor of the present embodiment has a light sending system (a first optical system) 51E to project an image of a slit as a predetermined pattern from an oblique direction to the resist surface 14a (target surface); a light receiving system (a second optical system) 52E to receive reflected light (including specular reflection light and diffracted light) from the resist surface 14a and from a surface near it, and again form an image of the slit; and a detecting system including a light receiving sensor 12 for photoelectrically converting the image of the slit formed by the light receiving system 52E and a signal processing system 13 to process a detected signal obtained by photoelectrically conversion. In the light sending system 51E, detection light DL (measurement light) in a wide band to which the resist on the wafer W is not sensitive, is emitted from a light source 1 such as a halogen lamp or a light emitting diode, to illuminate a slit 3a formed in a sending slit plate 3 and elongated in the Y-direction (or in an oblique direction to the Y-direction), through a condenser lens 2. The detection light DL emitted from the slit 3a travels through a second objective lens 4, a first aperture stop (first phase plate) 150, and a first objective lens 6 and is then incident obliquely to the resist surface 14a on the wafer W. The light sending system 51E is constructed including from the light source 1 to the first objective lens 6 along an optical path of the detection light DL. Namely, the light sending system 51E as a first optical system projects light onto the resist surface as the predetermined surface of the object from an oblique direction.

The second objective lens 4 and the first objective lens 6 form an image of the slit 3a on an intersecting point or nearby between the best focus plane BF and the optical axis of the light sending system 51E. Since the resist surface 14a is located on or near the best focus plane BF, the image of the slit 3a is obliquely projected onto the resist surface 14a.

The detection light DL incident to the resist surface 14a divides into light specularly reflected on the resist surface 14a and traveling toward the light receiving system 52E, and light traveling through the resist 14 toward the underlying surface Wa of the wafer W and reflected (specularly reflected and diffracted) on the underlying surface Wa toward the light receiving system 52E.

The detection light DL reflected on the resist surface 14a and on the underlying surface Wa is incident to the light receiving system 52E and travels through a first objective lens 7, a second aperture stop (a second phase plate) 180, and a second objective lens 9 to form a slit image on a receiving slit plate 10 in which a slit 10a is formed. Namely, the light receiving system 52E as the second optical system receives light from the wafer W a surface of which the resist 14 is applied onto. The detection light DL passing through the slit 10a travels through a relay lens 11 to be focused on a light receiving surface of a light receiving sensor 12 such as a photodiode. A detected signal DS by the light receiving sensor 12 is supplied to the signal processing system 13. The signal processing system 13 obtains from the detected signal DS information of a positional deviation amount (defocus amount) in the Z-direction of the resist surface 14a from the best focus plane BF as a surface position information. Namely, the light receiving sensor 12 receives light from the light receiving system 52E and the signal processing system 13 detects a position information in the Z-direction of the resist surface 14a from the detection signal DL generated by the light receiving sensor 12 based on the received light. The light receiving system 52E is constructed including from the first objective lens 7 to the relay lens 11 along with an optical path of the detection light DL.

With respect to the first objective lens 7 and the second objective lens 9, an intersecting point between the best focus plane BF and the optical axis of the light receiving system 52E is conjugate with a center of the slit 10a. The shape of the slit 10a is much the sane as the shape of a conjugate image of the slit 3a. If there is no reflected light from the underlying surface Wa and if the Z-position of the resist surface 14a agrees with the Z-position ZBF of the best focus plane BF, the image of the slit 3a will be formed approximately at the same position as the slit 10a and the light quantity (light intensity) of the light passing through the slit 10a and received by the light receiving sensor 12 will become maximum.

A Z-directional positional deviation of the resist surface 14a from the best focus plane BF will result in a horizontal shift of the center of the light quantity distribution of the slit image in a direction perpendicular to the Y-direction from the center of the slit 10a on the light receiving slit 10a. Therefore, the detected signal DS from the light receiving sensor 12 becomes maximum, as shown in FIG. 1D described later, when the Z-position of the resist surface 14a agrees with ZBF; the detected signal DS becomes weaker as the Z-position is shifted from ZBF. Using this relation, the signal processing system 13 is thus able to obtain a focus information as a surface position information corresponding to information on a focus position of the resist surface 14a at a projection position (measurement position) of the slit image on the resist surface 14a or on a defocus amount from the best focus plane BF through processing of the detected signal DS. In practice, for example, in order to remove influence of ambient light or the like and detect in which direction, +Z direction or −Z direction, the resist surface 14a is displaced from the best focus plane BF, the focus signal may be obtained, for example, as follows: the sending slit plate 3 is vibrated in the width direction of the slit 3a and the signal processing system 13 synchronously detects the detected signal DS in synchronism with the vibration to obtain the focus information. This synchronous detection technique is disclosed, for example, in U.S. Pat. No. 5,633,721 and Japanese Patent Application Laid-open No. 2007-48819.

Figure 9A:
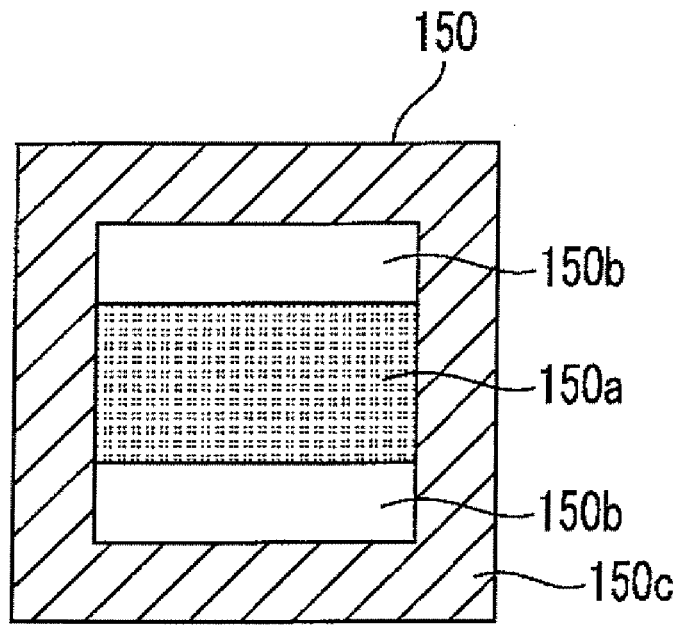
FIG. 9A is a drawing showing a first aperture stop 150 in FIG. 8.

The first aperture stop 150 in FIG. 9A is arranged at a pupil plane of the light sending system 51E or at a position near it in FIG. 8, and has a first region 150a of a rectangular shape which intersects at the optical axis of the light sending system 51E and the longitudinal direction of which is the Y-direction in FIG. 8; a pair of second regions 150b located both sides in the transverse direction of the first region 150a; and a shield portion 150c located so as to surround the first and second regions 150a, 150b. The first aperture stop 150 imparts a phase difference of about 180° (approximately $\lambda/2$ when based on a reference of a center wavelength $\lambda$ of the detection light DL) between the detection light DL passing through the center first region 150a and the detection light DL passing through the second regions 150b outside the first region 150a. For example, the first region 150a has a function as a phase shifting portion which shifts a phase of light passing through it to about 180° in comparison with light passing through the second region 150b. The second region 150b has a function as a transparent portion which makes an incident light pass through it without shifting a phase (or with imparting a predetermined phase shift).

Figure 9B:
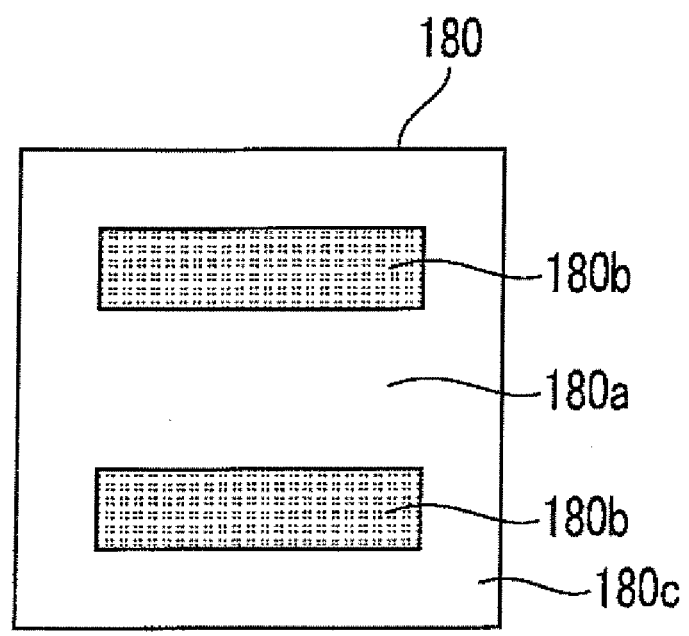
FIG. 9B is a drawing showing a second aperture stop 180 in FIG. 8.

A second aperture stop 180 in FIG. 9B is arranged at a pupil plane of the light receiving system 52E or at a position near the pupil plane so that the second aperture stop 180 is arrange at a position in the light receiving system 52E approximately conjugate with the arrangement plane of the first aperture stop 150 and has a shape approximately conjugate with the first and second regions 150a, 150b and the shield portion 150c of the first aperture stop 150. The second aperture stop 180 intersects at an optical axis of the light receiving system 52E and has a third region 180a of a rectangular shape the longitudinal direction of which is the Y-direction in FIG. 8; a pair of fourth regions 180b located at both sides in the transverse direction of the third region 180a; and a transparent portion 180c located so as to surround the third and fourth regions 180a, 180b.

The second aperture stop 180 imparts a phase difference of about 180° (approximately $\lambda/2$) between the detection light DL passing through the center third region 180a and the detection light DL passing through the fourth regions 180b outside the third region 180a. For example, the third region 180a has a function as a transparent portion which makes an incident light pass through it without shifting a phase (or with imparting a predetermined phase shift). The fourth region 180b has a function as a phase shifting portion which shifts a phase of light passing through it to about 180° in comparison with light passing through the second region 180a. The transparent portion 180c has a function as a transparent portion which makes an incident light pass through it without shifting a phase (or with imparting a predetermined phase shift).

Namely, the first and second aperture stops 150, 180 are arranged in optical paths of the light sending system 51E and the light receiving system 52E as a whole and function as a phase difference imparting system which imparts a phase difference between different portions from each other of light traveling via the underlying surface Wa as other surfaces except for the target surface, in the detection light DL from the light receiving system 52E.

The total area of the first region 150a is preferably equal to that of the pair of second regions 150b in the first aperture stop 150. The total area of the third region 180a is preferably equal to that of the pair of fourth regions 180b in the second aperture stop 180.

The pupil plane of the light sending system 51E/the light receiving system 52E can also be defined by two methods (a)

and (b) described below. The position near the pupil plane means that at least a positioning error in ordinary manufacture and assembly is permitted.

(a) A plane almost equivalent to an optical Fourier transform plane with respect to a plane passing the intersecting point between the target position (best focus plane BF) of the target surface for alignment and the optical axis of the light sending system 51E/the light receiving system 52E and being perpendicular to the optical axis.

(b) A front focal plane of the first objective lens 6 or a plane conjugate therewith.

A rear focal plane of a first objective lens 6 or a plane conjugate therewith.

In the present embodiment, the slit image formed on the receiving slit plate 10, in fact, contains a light quantity distribution by the reflected light from the underlying surface Wa. In order to relieve influence of the reflected light from the underlying surface Wa, the second aperture stop 180 is arranged at the position nearly conjugate with the arrangement plane of the first aperture stop 150 in the light sending system 51E, in the light receiving system 52E. The position nearly conjugate means that the position of the second aperture stop 180 is allowed to deviate from the plane conjugate with the first aperture stop 150 within a range in which the specular reflection light and diffracted light from the underlying surface Wa of the wafer W passes through respective regions in different phase characteristics (phase amounts imparted by transmission) in the second aperture stop 180 as described below. Since the first aperture stop 150 is arranged at the pupil plane of the light sending system 51E or at a position near it, the second aperture stop 180 may be arranged at the pupil plane of the light receiving system 52E or at a position near it.

Light passing through the third region 180a of the second aperture stop 180 is light having traveled from the first region 150a toward the resist surface 14a and having been specularly reflected on the resist surface 14a and on the underlying surface Wa. Light passing through the fourth regions 180b of the second aperture stop 180 is light having traveled from the second regions 150b toward the resist surface 14a and having been specularly reflected on the resist surface 14a and on the underlying surface Wa.

When the center wavelength of the detection light DL is defined as λ, a phase of λ/2 is imparted to the detection light passing through the first region 150a and no phase is imparted to the detection light passing through the second regions 150b. For this reason, there is a phase difference δ1 of about λ/2 (180°) between the detection light passing through the first region 150a and the detection light passing through the second regions 150b. On the other hand, no phase is imparted to the detection light passing through the third region 180a and a phase of λ/2 is imparted to the detection light passing through the fourth regions 180b. For this reason, there is also a phase difference δ2 of about λ/2 (180°) between the detection light passing through the third region 180a and the detection light passing through the fourth regions 180b. Since the detection light passing through the first region 150a and the third region 180a and the detection light passing through the second region 150b and the fourth region 180b are imparted the same amount of phases, those lights have the same phases after having passed through the second aperture stop 180 and have the same phase distributions before entering the first aperture stop 150 as a whole.

Namely, the first aperture stop 150 and the second aperture stop 180 as a phase difference imparting system as a whole impart a phase difference between different portions from each other of light traveling via the underlying surface Wa as a surface except for the target surface (other surfaces in the object) and make a phase distribution of light reflected on the resist surface 14a as the target surface substantially identical to a phase distribution of the detection light DL not entering the first aperture stop 150.

It is noted that the phase differences δ1, δ2 can be determined so as to be larger than λ/4 (90°) and smaller than 3λ0/4 (270°), because it is sufficient herein to achieve reduction in the intensity of interfering light between two beams passing through the first region 150a and the fourth regions 180b and in the intensity of interfering light between two beams passing through the second regions 150b and the third region 180a.

In FIG. 8, among the detection light DL applied from the light sending system 51E onto the resist surface 14a, the light (measurement light) 24 specularly reflected on the resist surface 14a (almost the entire light is specularly reflected herein), after having passed through the first region 150a in the light sending system 51E, passes mainly through the third region 180a in the light receiving system 52E and, after having passed through the second regions 150b in the light sending system 51E, passes mainly through the fourth regions 180b in the light receiving system 52E, to form the slit image on the position A1 on the receiving slit plate 10. The reason why the light 24 specularly reflected on the resist surface 14a behaves in this manner is that the first and second regions 150a, 150b of the first aperture stop 150 are almost conjugate with the third and fourth regions 180a, 180b, respectively, of the second aperture stop 180. If the resist surface 14a deviates in the Z-direction from the best focus plane BF, the position of the image of the slit by the light 24 will have a vertical positional deviation with respect to the optical axis of the light receiving system 52E along with the direction perpendicular to the light-receiving slit 10 in the Y-direction.

On the other hand, the light reaching the underlying surface Wa (pattern 15) through the resist 14 among the detection light DL applied onto the resist surface 14a, is specularly reflected in portion, and emitted as specular reflection light 21 (zeroth-order diffracted light) indicated by a solid line, and the rest is diffracted by the pattern 15 to be emitted as diffracted light (±first-order, ±second-order, and higher-order diffracted light) 22 indicated by dashed lines.

Since the point on the underlying surface Wa where the detection light DL passing through the resist 14 is incident has a downward positional deviation with respect to the optical axis of the light receiving system 52E from the point on the resist surface 14a where the detection light DL impinges, the specular reflection light 21 and diffracted light 22 from the underlying surface Wa is focused at a position B1 positionally deviating upward from the position A1 on the receiving slit plate 10, through the objective lenses 7 and 9. Among the detection light DL applied from the light sending system 51E onto the underlying surface Wa, the light 21 specularly reflected on the underlying surface Wa, after having passed through the first region 150a in the light sending system 51E, passes mainly through the third region 180a in the light receiving system 52E and, after having passed through the second regions 150b in the light sending system 51E, passes mainly through the fourth regions 180b in the light receiving system 52E, to form the slit image on the position B1 on the receiving slit plate 10. On the other hand, among the detection light DL applied from the light sending system 51E onto the underlying surface Wa, the light 22 diffracted on the underlying surface Wa, after having passed through any of the first and second regions 150a, 150b in the light sending system 51E, a portion of the light 22 passes through the third region 180a and the other of the light 22 passes through the fourth region 180b, to form the slit image on the position B1 on the receiving slit plate 10.

In this case, therefore, the light focused at the position B1 contains the components of the different phases having the phase difference of about 180° and thus the light focused at the position B1 reduce its intensity by interference.

Namely, in the light received at the light receiving sensor 12, the intensity of the light from the underlying surface Wa in the light from the wafer W a surface of which the resist 14 is applied onto is reduced by imparting a phase difference between at least a portion and another portion of specular reflection light and diffracted light on the underlying surface Wa as light other than reflected light on the resist surface 14a.

Figure 2:
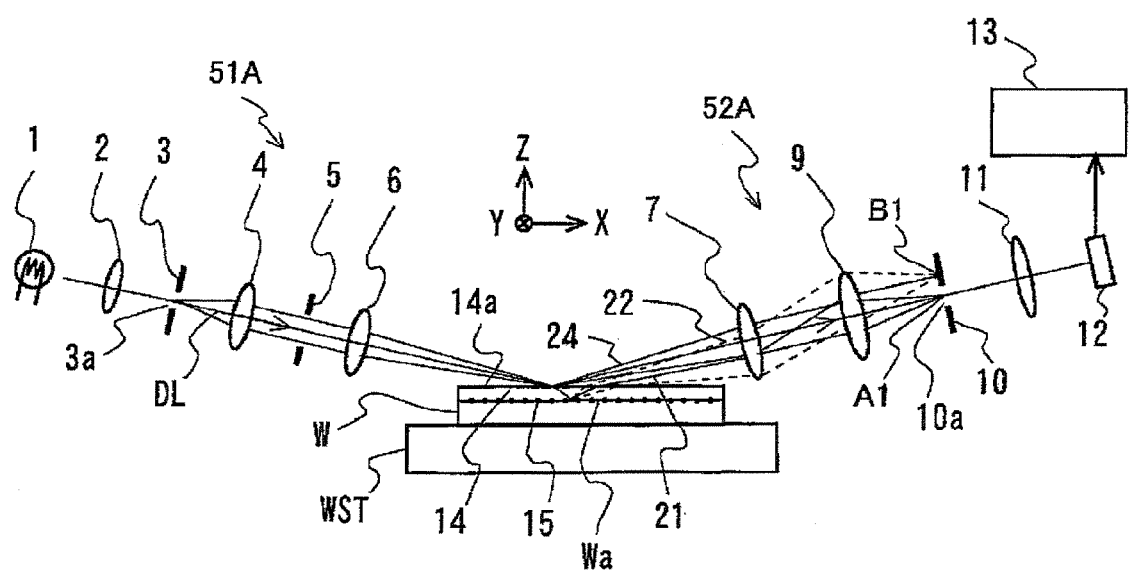
FIG. 2 is a drawing showing the AF sensor of FIG. 1A without the phase difference plate 8.

In contrast to it, if the first aperture stop 150 is not provided in the light sending system and the second aperture stop 180 is not provided in the light receiving system as shown in FIG. 2, the specular reflection light 21 and diffracted light 22 from the underlying surface Wa is focused in the same phase at the position B1 on the receiving slit plate 10. Accordingly, the intensity of the light focused at the position B1 is not reduced and the centroid of the light quantity distribution of the slit image on the receiving slit plate 10 has an upward positional deviation by focused light at the position B1, so as to cause an error in the measurement result of the Z-position of the resist surface 14a.

The operational effects and others of the present embodiment are as follows.

(1) The AF sensor of the present embodiment in FIG. 8 is the surface position detecting apparatus to detect the position information (surface position information) in the Z-direction of the resist surface 14a (target surface) positioned on the plane crossing the Z-direction (detection direction), which comprises: the light sending system 51E to project the image of the slit 3a (predetermined pattern) from an oblique direction onto the resist surface 14a; the light receiving system 52E to receive the light having traveled via the resist surface 14a, to form the image of the slit; and the light receiving sensor 12 and the signal processing system 13 to detect the focus information as the position information in the Z-direction of the resist surface 14a based on the image of the slit formed by the light receiving system 52E. Furthermore, the AF sensor comprises the first aperture stop 150 and the second aperture stop 180 chase imparting system) to impart the phase difference between the first portion and the second portion of the light projected from the light sending system 51E, traveling via the underlying surface Wa at the different position from the resist surface 14a in the Z-direction to enter the light receiving system 52E and traveling from the light receiving system 52E toward the light-receiving slit 10. The light traveling via the underlying surface Wa to enter the light receiving system 52E contains the specular reflection light 21 and diffracted light 22 on the underlying surface Wa. Furthermore, the first and second portions of the light traveling via the underlying surface Wa to enter the light receiving system 52E may contain portion of the specular reflection light 21 and portion of the diffracted light 22, respectively.

Accordingly, there is the phase difference between the specular reflection light 21 and diffracted light 22 arising from the underlying surface Wa, whereby the light intensity at the position B1 where the specular reflection light 21 and diffracted light 22 impinge by the light receiving system 52E is reduced by interference in comparison with when the first aperture stop 150 and the second aperture stop 180 are not provided. Therefore, the intensity of the light from the underlying surface Wa is lowered and even if there is the underlying surface Wa different from the detection target, near the target surface, the Z-position (surface position information) of the target surface (resist surface 14a) can be detected with high accuracy.

(2) In the present embodiment, the phase difference δ given between different portions (the first and second portions) of the light (the specular reflection light 21 and diffracted light 22) traveling via the underlying surface Wa in the detection light from the light receiving system 52E is preferably larger than 90° and smaller than 270°, namely larger than λ/4 and smaller than 3λ/4 based on the reference of the center wavelength λ of the detection light DL applied onto the resist surface 14a. This configuration reduces the intensity of the light impinging on the position B1, when compared with the case without the phase difference imparting system, and thus improves the measurement accuracy of the Z-position of the target surface.

The phase difference δ is more preferably set to about 180° (λ/2). This configuration makes the intensity of the light impinging on the position B1, approximately minimum and thus permits measurement of the Z-position of the target surface with the highest accuracy.

(3) The optical system for imparting the phase difference δ includes the sending-side first aperture stop 150 located at the pupil plane or nearby of the light sending system 51E or at a position near it, and the second aperture stop 180 located at the pupil plane of the light receiving system 52E or at a position near it, namely at a position approximately conjugate with an arrangement plane of the first aperture stop 150 in the light receiving system 52E.

Each of the first aperture stop 150 and the second aperture stop 180 can be arranged at or near the pupil plane of the optical system while serving as an ordinary aperture stop, which can prevent the optical system from becoming complicated.

Divergence angles (diffraction angles) and directions of the diffracted light 22 arising from the underlying surface Wa of the wafer W are dependent upon the pattern pitch and periodic direction of the pattern 15 on the underlying surface Wa. It is thus preferable, for example, to select the most effective sizes (aperture sizes) of the first and second regions 150a, 150b of the first aperture stop 150 and the third and fourth regions 180a, 180b of the second aperture stop 180 from a distribution of pitches and directions of the pattern 15 that can be recognized from exposure data in preceding steps of the wafer W. For this purpose, it can be contemplated that plural kinds of first aperture stop 150 and second aperture stop 180, whose aperture sizes are different from each other, are prepared in advance and optimal first and second aperture stops 150, 180 are selected and set according to information of the pattern 15 in a preceding layer on the wafer W.

(4) In the present embodiment, the target surface is the surface of the resist (coating) applied on the upper surface of the wafer W (substrate) and the light having the first and second portions with the phase difference is the light having traveled via the pattern 15 formed on the upper surface (the underlying surface Wa) of the wafer W. Therefore, the present embodiment is effective, particularly, to measurement of surface position in execution of exposure in the second or subsequent layer on the wafer W.

(5) The light sending system 51E in FIG. 8 has the illumination system consisting of the light source 1 and condenser lens 2. However, the illumination system can be omitted, for example, where a pattern generator of a self-emission type to emit light from the portion of the slit 3a is used instead of the slit plate 3.

In the present embodiment, the phase imparting means includes the first aperture stop 150 arranged in the light sending system 51E and the second aperture stop 180 arranged in the light receiving system 52E. Then the first aperture stop 150 has the first region 150a to impart the predetermined phase to passing light and the second aperture stop 180 has the fourth region 180b to impart the predetermined phase to passing light.

In the present embodiment, although the first aperture stop 150 and the second aperture stop 180 are transparent type elements to make entering light pass through them, at least one of the elements constructed the phase difference imparting system may be a reflecting type element to reflect incident light. In this case, for example, the regions corresponding to the first region 150a and the fourth region 180b can be respectively reflecting surfaces which have the predetermined phase difference (namely, the step) to the regions corresponding to the second region 150b and the third region 180a. When this type of reflecting element is used, the first objective lens 6, 7 and the second objective lens 4, 9 or the like can be arranged arbitrarily in response to the optical path of the reflected light.

Namely, according to the present embodiment, a phase difference is imparted between different portions from each other in light traveling via surfaces other than the predetermined surface when a position information of the predetermined surface is detected and there are other surfaces except for the predetermined surface near the predetermined surface. Therefore, reduction occurs in the intensity of the image (converged light) formed by the second optical system based on the light traveling via surfaces other than the predetermined surface. Since the intensity of the light from the surfaces except for the predetermined surface in the object reduces as described above, the surface position information of the predetermined surface can be detected with high accuracy even if there is other surfaces except for the predetermined surface near the predetermined surface.

Figure 10:
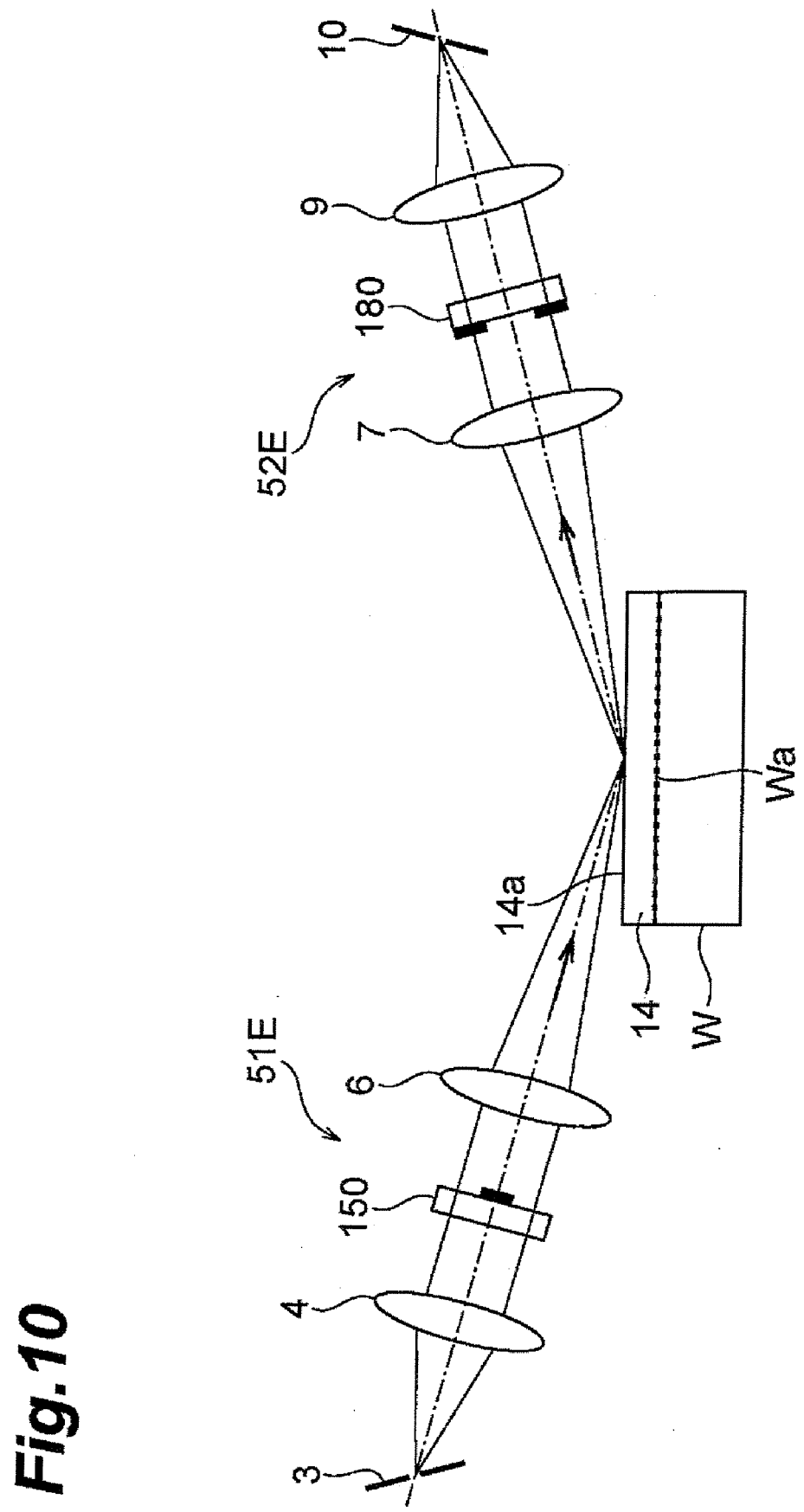
FIG. 10 is a drawing schematically showing a configuration of the AF sensor in the first embodiment in a case where a wafer W is arranged as inclined.

FIG. 10 shows an example where the wafer W is arranged as inclined relative to the AF sensor according to the present embodiment. FIG. 11A is a drawing showing a relation of the first aperture stop 150 with wavefronts of light at respective positions in the AF sensor. In FIG. 11A, wavefront WF1 represents a wavefront between the second objective lens 4 and the first aperture stop 150; wavefront WF2 represents a wavefront between the first aperture stop 150 and the first objective lens 6; wavefront WF3 represents a wavefront between the first objective lens 7 and the second aperture stop 180; wavefront WF4 represents a wavefront between the second aperture stop 180 and the second objective lens 9. The wavefront WF2 after passage through the first aperture stop 150 is provided with a predetermined phase in the portion where the light passes through the first region 150a. Where the wafer W is inclined, the center position of the wavefront of the light reflected on the underlying surface Wa deviates like the wavefront WF3 as shown in FIG. 11A. As a result, the wavefront VF4 after passage through the second aperture stop 180 comes to have a projection and a depression corresponding to the phase difference of the wavefronts WF2, WF3 in portions corresponding to the boundaries between the first and second regions 150a, 150b. These will reduce the contrast of the image formed on the receiving slit 10, namely the contrast of the detection signal DS.

For overcoming it, it is possible, for example, to use the first aperture stop 150A in which shield portions are provided at boundary regions 150ab between the first region 150a and the second regions 150b, as shown in FIG. 11B. FIG. 11B is a drawing showing a relation of the first aperture stop 150A with wavefronts of light at respective positions in the AF sensor. In FIG. 11B, wavefront WF1A represents a wavefront between the second objective lens 4 and the first aperture stop 150; wavefront WF2A represents a wavefront between the first aperture stop 150 and the first objective lens 6; wavefront WF3A represents a wavefront between the first objective lens 7 and the second aperture stop 180; wavefront WF4A represents a wavefront between the second aperture stop 180 and the second objective lens 9. In this case, when the wafer W is arranged as inclined, a projection and a depression corresponding to the phase difference of the wavefronts WF2A, WF3A in portions corresponding to the boundaries between the first and second regions 150a, 150b are not formed, and the wavefront WF4A after passage through the second aperture stop 180 becomes approximately as flat as the wavefront WFV1A. As a result, the AF sensor using the first aperture stop 150A is able to prevent reduction in contrast of the image of the slit on the light receiving slit 10.

Second Embodiment

The present embodiment is an application of the present invention to an AF sensor which is incorporated, for example, in an exposure apparatus and which detects surface position information of a surface of a resist (photosensitive material) applied onto a surface of a wafer.

Figure 1A:
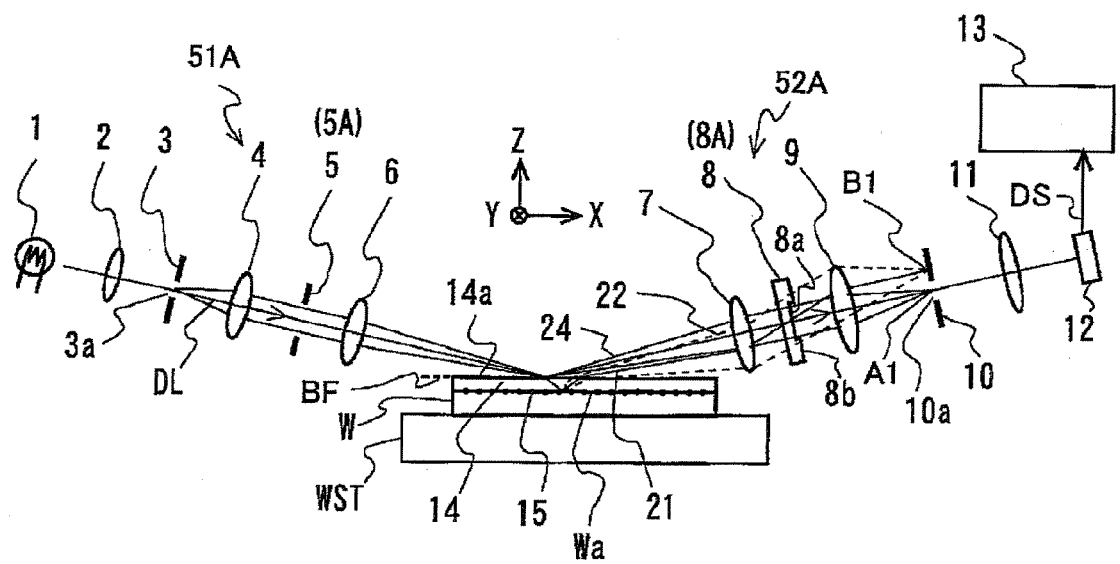
FIG. 1A is a drawing showing a configuration of an AF sensor in the second embodiment.

FIG. 1A shows the AF sensor of the present embodiment and in FIG. 1A a wafer W is held on a wafer stage WST by vacuum suction or the like through an unrepresented wafer holder. The wafer W is provided with a coating of a resist 14 in a thickness of about 100-300 nm, for example, on a surface of a substrate of a disk shape with the diameter of about 200-300 mm of a semiconductor (e.g., silicon), SOI (silicon on insulator), or the like. In FIG. 1A and other drawings, the resist 14 is depicted in a thickness much larger than its actual thickness, for convenience' sake of description. There are cases where an antireflection film or the like is further formed on the surface of the resist 14. It is assumed that a pattern 15 with periodicity such as a circuit pattern and alignment marks is formed in preceding steps, on an underlying surface Wa (a back surface of the resist 14) which is a surface of a substrate of the wafer W. The description hereinafter will be based on the coordinate system in which the Z-axis is taken along a direction of a normal to a guide surface (not shown) of the wafer stage WST nearly parallel to a mounting surface of the wafer W, the X-axis along a direction parallel to the plane of FIG. 1A in a plane perpendicular to the Z-axis, and the Y-axis along a direction normal to the plane of FIG. 1A.

In the present embodiment, the pattern 15 on the underlying surface Wa is a pattern that can be regarded as isolated lines extending in the Y-direction, but it may also be a pattern that can be regarded as isolated lines extending in the X-direction, or a pattern periodic in the X- and Y-directions. There appears the first-order and higher-order diffracted light as well as specular reflection light (zeroth-order diffracted light) from the pattern 15, and the first-order and higher-order diffracted light will be simply called diffracted light. A surface (hereinafter referred to as a resist surface) 14a of the resist 14 on the wafer W as a target surface is approximately perpendicular to the Z-axis (or approximately parallel to the XY plane), but the Z-directional position (Z-position or focus position) thereof differs depending upon positions in the X- and Y-directions because of variation in the thickness of the substrate of the wafer W, level differences of the underlying pattern, or the like.

The wafer stage WST is configured to drive the wafer W in the X- and Y-directions and to control the Z-position of the wafer W and angles of inclination thereof around the X-axis and the Y-axis so as to set an average plane of the resist surface 14a in an exposure region illuminated with illumination light for exposure, within a width of the depth of focus with respect to a best focus plane BF (a target position of the target surface by the AF sensor) of the projection optical system (not shown), based on a distribution (surface position information) of Z-positions of the resist surface 14a on the wafer W measured by the AF sensor.

The AF sensor of the present embodiment has a light sending system 51A to project an image of a slit as a predetermined pattern from an oblique direction to the resist surface 14a (target surface); a light receiving system 52A to receive reflected light (including specular reflection light and diffracted light) from the resist surface 14a and from a surface near it, again form an image of the slit; a light receiving sensor 12 to photoelectrically convert the image of the slit formed by the light receiving system 52A; and a signal processing system 13 to process a detected signal obtained by the photoelectrically conversion. In the light sending system 51A, detection light DL (measurement light) in a wide band to which the resist on the wafer W is not sensitive, is emitted from a light source 1 such as a halogen lamp or a light emitting diode, to illuminate a slit 3a formed in a sending slit plate 3 and elongated in the Y-direction (or in an oblique direction to the Y-direction), through a condenser lens 2. The detection light DL emitted from the slit 3a travels through a second objective lens 4, a sending-side stop 5 (aperture stop), and a first objective lens 6 and is then incident obliquely to the resist surface 14a. The light sending system 51A is constructed including from the light source 1 to the first objective lens 6 along with the optical path of the detection light DL.

Figure 1B:
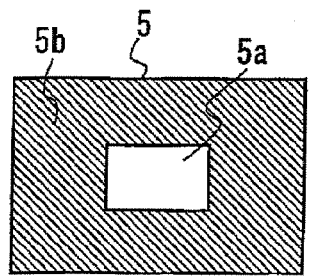
FIG. 1B a drawing showing a sending-side stop 5 in FIG. 1A.

The second objective lens 4 and the first objective lens 6 form an image of the slit 3a on an intersecting point between the best focus plane BF (target position of the target surface for alignment) and the optical axis of the light sending system 51A. Since the resist surface 14a is located on or near the best focus plane BF, the image of the slit 3a is obliquely projected onto the resist surface 14a. In the sending-side stop 5, as shown in FIG. 1B, there is a rectangular aperture 5a to transmit light, formed in a center of a shield portion 5b. The sending-side stop 5 is arranged at the pupil plane of the light sending system 51A or at a position near it. The aperture 5a functions as a transparent portion where an incident light passes through without shifting a phase (or with imparting a predetermined phase shift) and the shield portion 5b functions as a shield portion which blocks an incident light.

The pupil plane of the light sending system 51A/the light receiving system 52A can also be defined by two methods (a) and (b) described below. The position near the pupil plane means that at least a positioning error in ordinary manufacture and assembly is permitted.

(a) A plane almost equivalent to an optical Fourier transform plane with respect to a plane passing the intersecting point between the target position (best focus plane BF) of the target surface for alignment and the optical axis of the light sending system 51A/the light receiving system 52A and being perpendicular to the optical axis.

(b) A front focal plane of the first objective lens 6 or a plane conjugate therewith.

A rear focal plane of a first objective lens 7 or a plane conjugate therewith.

The detection light DL incident to the resist surface 14a divides into light specularly reflected on the resist surface 14a and traveling toward the light receiving system 52A, and light traveling through the resist 14 toward the underlying surface Wa of the wafer W and reflected (specularly reflected and diffracted) on the underlying surface Wa toward the light receiving system 52A.

The detection light DL reflected on he resist surface 14a and on the underlying surface Wa is incident to the light receiving system 52A and travels through a first objective lens 7, a phase difference plate 8 (phase plate or aperture stop), and a second objective lens 9 to form a slit image on a receiving slit plate 10 in which a slit 10a is formed. The light passing through the slit 10a travels through a relay lens 11 to be focused on a light receiving surface of a light receiving sensor 12 such as a photodiode. A detected signal DS by the light receiving sensor 12 is supplied to the signal processing system 13. The signal processing system 13 obtains from the detected signal DS information of a positional deviation amount (defocus amount) in the Z-direction of the resist surface 14a from the best focus plane BF as a surface position information. Namely, the light receiving sensor 12 receives light from the light receiving system 52A and the signal processing system 13 detects a position information of in the Z-direction of the resist surface 14a from the detection signal DS generated by the light receiving sensor 12 based on the light. The light receiving system 52A is constructed including from the first objective lens 7 to the relay lens 11 along with the optical path of the detection light DL.

With respect to the first objective lens 7 and the second objective lens 9, an intersecting point between the best focus plane BP and the optical axis of the light receiving system 52A is conjugate with a center of the slit 10a. The shape of the slit 10a is much the same as the shape of a conjugate image of the slit 3a. If there is no reflected light from the underlying surface Wa and if the Z-position of the resist surface 14a agrees with the Z-position ZBF of the best focus plane BF, the image of the slit 3a will be formed approximately at the same position as the slit 10a and the light quantity (light intensity) of the light passing through the slit 10a and received by the light receiving sensor 12 will become maximum.

A Z-directional positional deviation of the resist surface 14a from the best focus plane BF will result in a horizontal shift of the center of the light quantity distribution of the slit image in a direction perpendicular to the Y-direction from the center of the slit 10a on the light receiving slit 10. Therefore, the detected signal DS from the light receiving sensor 12 becomes maximum, as shown in FIG. 1D, when the Z-position of the resist surface 14a agrees with ZBF; the detected signal DS becomes weaker as the Z-position is shifted from ZBF. Using this relation, the signal processing system 13 is thus able to obtain a focus information as a surface position information corresponding to information on a focus position of the resist surface 14a at a projection position (measurement position) of the slit image on the resist surface 14a or on a defocus amount from the best focus plane BF through processing of the detected signal DS. In practice, for example, in order to remove influence of ambient light or the like and detect in which direction, +Z direction or −Z direction, the resist surface 14a is displaced from the best focus plane BF, the focus signal may be obtained, for example, as follows: the sending slit plate 3 is vibrated in the width direction of the slit 3a and the signal processing system 13 synchronously detects the detected signal DS in synchronism with the vibration to obtain the focus information. This synchronous detection technique is disclosed, for example, in U.S. Pat. No. 5,633,721 and Japanese Patent Application Laid-open No. 2007-48819.

In the present embodiment, the slit image formed on the receiving slit plate 10, in fact, contains a light quantity distribution by the reflected light from the underlying surface Wa. In order to relieve influence of the reflected light from the underlying surface Wa, the phase difference plate 8 is arranged at the position nearly conjugate with the arrangement plane of the sending-side stop 5 in the light sending system 51A, in the light receiving system 52A. The position nearly conjugate means that the position of the phase difference plate 8 is allowed to deviate from the plane conjugate with the sending-side stop 5 within a range in which the specular reflection light and diffracted light from the underlying surface Wa of the wafer W passes through respective regions with different phase characteristics (phase amounts imparted by transmission) in the phase difference plate 8 as described below. Since the sending-side stop 5 is arranged at the pupil plane of the light sending system 51A or at a position near it, the phase difference plate 8 may be arranged at the pupil plane of the light receiving system 52A or at a position near it.

Figure 1C:
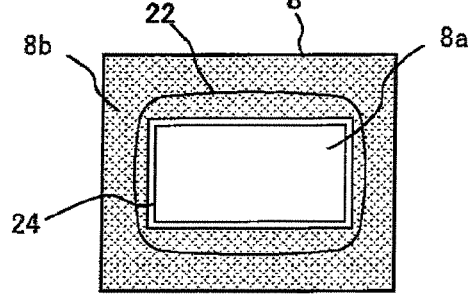
FIG. 1C a drawing showing a phase difference plate 8 in FIG. 1A.
Figure 1D:
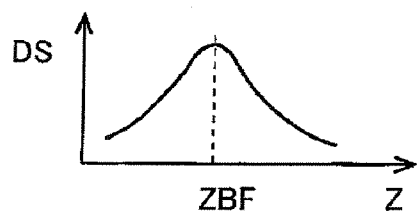
FIG. 1D a drawing showing an example of a detected signal obtained from a light receiving sensor 12 in FIG. 1A.

FIG. 1C is a plan view showing the phase difference plate 8 in FIG. 1A. In FIG. 1C the phase difference plate 8 has a rectangular transparent portion 8a of much the same shape and at the same position as a conjugate image of the aperture 5a of the sending-side stop 5 in FIG. 1B, and a phase difference portion 8b of a frame shape around the transparent portion 8a. The contour of the phase difference portion 8b is, for example, a shape with about three times the height and width of the transparent portion 8a and the region around it is a shield portion. For example, the transparent portion 8a has a function as a transparent portion which makes an incident light pass through it without shifting a phase (or with imparting a predetermined phase shift). The phase difference portion 8b has a function as a phase shifting portion which shifts a phase of light passing through it to about 180° in comparison with light passing through the transparent portion 8a.

When the center wavelength of the detection light DL is defined as $\lambda$, the phase difference $\delta$ between the detection light passing through the transparent portion 8a and the detection light passing through the phase difference portion 8b is set to be approximately $\lambda/2$ (180°). This phase difference plate 8 can be made, for example, by forming a recess in a depth d by etching or the like in the portion corresponding to the transparent portion 8a in a glass substrate of a flat plate shape. When the refractive index of the glass substrate is defined as na and the refractive index of gas in the optical path where the detection light DL passes is defined as nb, the condition for the depth d is given by the following equation, using a predetermined integer k (k=0, 1, 2, ...).

$$(na-nb)d=(½+k)\lambda \quad (1)$$

Since it is sufficient to reduce the intensity of interfering light between the two light beams passing through the transparent portion 8a and through the phase difference portion 8b as described below, the phase difference $\delta$ can be determined to be larger than $\lambda/4$ (90°) and smaller than $3\lambda/4$ (270°) as described below.

$$\lambda/4<\delta<3\lambda/4 \quad (2)$$

In FIG. 1A, among the detection light DL applied from the light sending system 51A onto the resist surface 14a, the light (measurement light) 24 specularly reflected on the resist surface 14a (almost the entire light is specularly reflected herein) passes mainly through the transparent portion 8a of the phase difference plate 8 in the light receiving system 52A to form a slit image at the position A1 on the receiving slit plate 10. The reason why the light 24 specularly reflected on the resist surface 14a passes through the transparent portion 8a is that the aperture 5a of the sending-side stop 5 is approximately conjugate with the transparent portion 8a of the phase difference plate 8. If the resist surface 14a deviates in the Z-direction from the best focus plane BF, the position of the image of the slit by the light 24 will have a vertical positional deviation with respect to the optical axis of the light receiving system 52A along with a direction perpendicular to the light receiving slit 10 in the Y-direction.

On the other hand, the light reaching the underlying surface Wa (pattern 15) through the resist 14 among the detection light DL applied onto the resist surface 14a, is specularly reflected in portion, and emitted as specular reflection light 21 (zeroth-order diffracted light) indicated by a solid line, and the rest is diffracted by the pattern 15 to be emitted as diffracted light (±first-order, ±second-order, and higher-order diffracted light) 22 indicated by dashed lines.

Since the pattern 15 is a pattern that can be regarded as isolated lines extending in the Y-direction, the diffracted light 22, in fact, appears in a state in which it overlaps with the specular reflection light (zeroth-order diffracted light) 21 as shown in FIG. 1C.

Since the point on the underlying surface Wa where the detection light DL passing through the resist 14 is incident has a downward positional deviation with respect to the optical axis of the light receiving system 52A from the point on the resist surface 14a where the detection light DL impinges, the specular reflection light 21 and diffracted light 22 from the underlying surface Wa is focused at a position B1 positionally deviating upward from the position A1 on the receiving slit plate 10, through the objective lenses 7 and 9. In this case, the light focused at the position B1 contains the components of the different phases having the phase difference of about 180° and thus the intensity of the light focused at the position B1 is reduced.

In contrast to it, if the phase difference plate 8 is not provided in the light receiving system 52A as shown in FIG. 2, the specular reflection light 21 and diffracted light 22 from the underlying surface Wa is focused in the same phase at the position B1 on the receiving slit plate 10. Accordingly, the intensity of the light focused at the position B1 is not reduced and the centroid of the light quantity distribution of the slit image on the receiving slit plate 10 has an upward positional deviation by the light focused on the position B1, so as to cause an error in the measurement result of the Z-position of the resist surface 14a.

The operational effects and others of the present embodiment are as follows.

(1) The AF sensor of the present embodiment in FIG. 1A is the surface position detecting apparatus to detect the position information (surface position information) in the Z-direction of the resist surface 14a (target surface) positioned on the plane crossing the Z-direction (detection direction), which comprises: the light sending system 51A to project the image of the slit 3a (predetermined pattern) from an oblique direction onto the resist surface 14a; the light receiving system 52A to receive the light having traveled via the resist surface 14a, to form the image of the slit; and the light receiving sensor 12 and the signal processing system 13 to detect the focus information as the position information in the Z-direction of the resist surface 14a based on the image of the slit formed by the light receiving system 52A. Furthermore, this AF sensor comprises the sending-side stop 5 and the phase difference plate 8 chase difference imparting system) to impart the phase difference between different portions (the first portion and the second portion) of the light projected from the light sending system 51A, traveling via the underlying surface Wa to enter the light receiving system 52A and traveling from the light receiving system 52E toward the light-receiving slit 10. The light traveling via the underlying surface Wa to enter the light receiving system 52A contains the specular reflection light 21 and diffracted light 22 on the underlying surface Wa. Furthermore, the first and second portions of the light traveling via the underlying surface Wa to enter the light receiving system 52E may contain portion of the specular reflection light 21 and portion of the diffracted light 22, respectively.

Accordingly, there is the phase difference between the specular reflection light 21 and portion of the diffracted light 22 arising from the underlying surface Wa, whereby the light intensity at the position B1 where the specular reflection light 21 and portion of the diffracted light 22 impinge in the light receiving system 52A is reduced by interference more than when the phase difference plate 8 is not provided. Therefore, the intensity of the light from the surface except for the target surface becomes lowered and even if there is the surface different from the detection target, near the target surface, the Z-position (surface position information) of the target surface (resist surface 14a) can be detected with high accuracy.

(2) In the present embodiment, the phase difference δ imparted between the different portions (the first and second portions) from each other in the light (the specular reflection light 21 and portion of the diffracted light 22) traveling via the underlying surface Wa in the detection light from the light receiving system 52A is preferably larger than 90° and smaller than 270°, namely larger than $\lambda/4$ and smaller than $3\lambda/4$ based on the reference of the center wavelength $\lambda$ of the detection light DL applied onto the resist surface 14a. This configuration reduces the intensity of the light impinging on the position B1, when compared with the case without the phase difference plate 8, and thus improves the measurement accuracy of the Z-position of the target surface.

The phase difference δ is more preferably set to about 180° ($\lambda/2$). This configuration makes the intensity of the light impinging on the position B1, approximately minimum and thus permits measurement of the Z-position of the target surface with the highest accuracy.

(3) The optical system for imparting the phase difference δ includes the sending-side stop 5 (aperture stop) located at the pupil plane of the light sending system 51A or at a position near it, and the phase difference plate 8 (phase plate) located at the pupil plane of the light receiving system 52A or at a position near it, namely at a position approximately conjugate with an arrangement plane of the sending-side stop 5 in the light receiving system 52A.

Each of the sending-side stop 5 and the phase difference plate 8 can be arranged at or near the pupil plane of the optical system while serving as an ordinary aperture stop, which can prevent the optical system from becoming complicated.

Divergence angles (diffraction angles) and directions of the diffracted light 22 arising from the underlying surface Wa of the wafer W are dependent upon the pattern pitch and periodic direction of the pattern 15 on the underlying surface Wa. It is thus preferable, for example, to select the most effective sizes (aperture sizes) of the aperture 5a of the sending-side stop 5 and the transparent portion 8a of the phase difference plate 8 from a distribution of pitches and directions of the pattern 15 that can be recognized from exposure data in preceding steps of the wafer W. For this purpose, it can be contemplated that plural kinds of sending-side stop 5 and phase difference plate 8, whose aperture sizes are different from each other, are prepared in advance and optimal sending-side stop 5 and phase difference plate 8 are selected and set according to information of the pattern 15 in a preceding layer on the wafer W.

(4) In the present embodiment, the target surface is the surface of the resist (coating) applied on the upper surface of the wafer W (substrate) and the light as an object to which the phase difference is imparted is the light having traveled via the pattern 15 formed on the underlying surface Wa of the upper surface of the wafer W. Therefore, the present embodiment is effective, particularly, to measurement of surface position in execution of exposure in the second or subsequent layer on the wafer W.

Figure 3A:
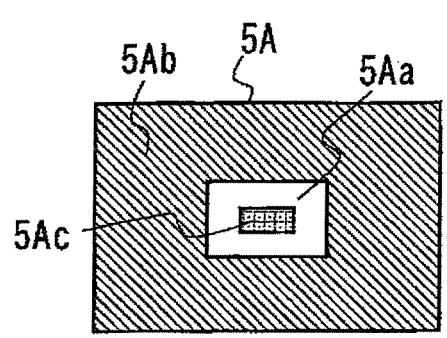
FIG. 3A is a drawing showing another sending-side stop 5A.
Figure 3B:
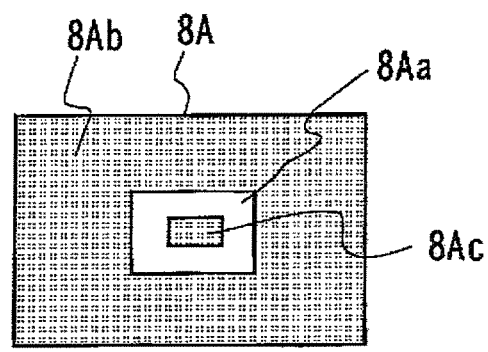
FIG. 3B a drawing showing another phase difference plate 8A.

(5) When the divergence angles of the diffracted light from the pattern 15 of the underlying surface Wa are small, the sending-side stop 5 and the phase difference plate 8 of the above embodiment in FIG. 1A may be replaced by a sending-side stop 5A (first phase plate) in FIG. 3A and a phase difference plate 8A in FIG. 3B (or a phase difference plate 8B in FIG. 3D) (second phase plate), respectively.

The sending-side stop 5A in FIG. 3A is arranged at the pupil plane of the light sending system 51A in FIG. 1A or at a position near it, and has a first region 5Ac intersecting to the optical axis of the light sending system 51A, at least one second region 5Aa of a frame shape outside the first region 5Ac, and a shield portion 5Ab of the same shape as the shield portion 5b in FIG. 1B. The phases of the detection light DL passing through the center first region 5Ac and passing through the second region 5Aa outside it are so determined that the phases differ by about 180° ($\lambda/2$). Namely, the first region 5Ac has a function as a phase shifting portion which shifts a phase of light passing through it to about 180° in comparison with light passing through the second region 5Aa. The second region 5Aa has a function as a transparent portion which makes an incident light pass through it without shifting a phase (or with imparting a predetermined phase shift).

The phase difference plate 8A in FIG. 3B is arranged at the position in the light receiving system 52A approximately conjugate with the arrangement plane of the sending-side stop 5A, and has a first region 8Ac and at least one second region 8Aa outside the first region having their respective shapes approximately conjugate with those of the regions 5Ac, 5Aa of the sending-side stop 5A and imparting much the same phase difference. A region 8Ab around these regions 8Ac, 8Aa imparts a phase difference approximately 180° different from that by its inside region. In FIG. 8B, when the phase of the light passing through the middle region 8Aa is assumed to be 0°, the phases of light passing through the center region 8Ac and through the outside region 8Ab are approximately 180°. Namely, the region 8Ac has a function as a phase shifting portion which shifts a phase of light passing through it to about 180° in comparison with light passing through the region 8Aa. The portion 8Aa has a function as a transparent portion which makes an incident light pass through it without shifting a phase (or with imparting a predetermined phase shift). The region 8Ab has a function as a phase shifting portion (an additional phase shifting portion) which shifts a phase of light passing through it to about 180° in comparison with light passing through the region 8Aa.

Figure 3C:
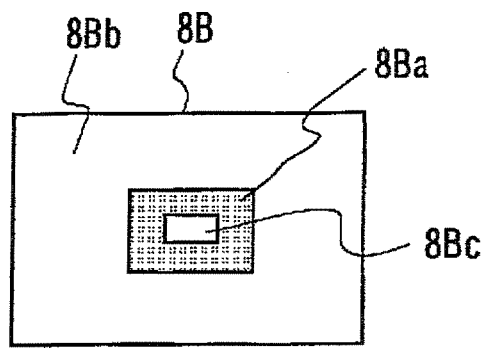
FIG. 3C a drawing showing a phase difference plate 8B with phases opposite to those of the phase difference plate 8A.

Instead of the phase difference plate 8A in FIG. 3B, it is also possible to use a phase difference plate 8B in which the phase of light passing through a center region 8Bc is 0° and in which the phases of light passing through an outside region 8Ba and through a further outside region 8Bb successively vary each by about 180°, as shown in FIG. 3C. Namely, the region 8Bc has a function as a transparent portion which makes an incident light pass through it without shifting a phase (or with imparting a predetermined phase shift). The region 8Ba has a function as a phase shifting portion which shifts a phase of light passing through it to about 180° in comparison with light passing through the region 8Bc. The portion 8Bb has a function as a transparent portion which makes an incident light pass through it without shifting a phase (or with imparting a predetermined phase shift).

Figure 3D:
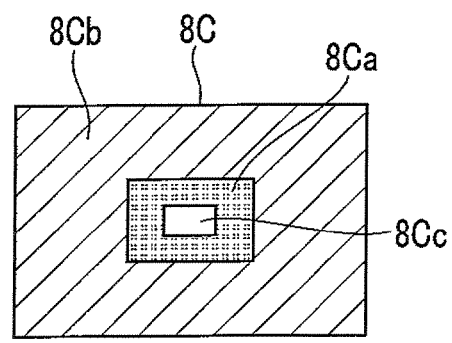
FIG. 3D a drawing showing a phase difference plate 8C as a modification example of the phase difference plate 8A.

Alternatively, instead of the phase difference plate 8A in FIG. 3B, it is also possible to use a phase difference plate 8C in which the phase of light passing through a center region 8Cc is 0°, the phase of light passing through an outside region 8Ca varies by about 180°, and a region 8Cb outside the region 8Ca is a shield portion, as shown in FIG. 3D. Namely, the region 8Cc has a function as a transparent portion which makes an incident light pass through it without shifting a phase (or with imparting a predetermined phase shift). The region 8Ca has a function as a phase shifting portion which shifts a phase of light passing through it to about 180° in comparison with light passing through the region 8Cc. The region 8Cb has a function as a shield portion which blocks an incident light.

(7) The light sending system 51A in FIG. 1A has the illumination system consisting of the light source 1 and condenser lens 2. However, the illumination system can be omitted, for example, where a pattern generator of a self-emission type to emit light from the portion of the slit 3a is used instead of the slit plate 3.

Figure 4A:
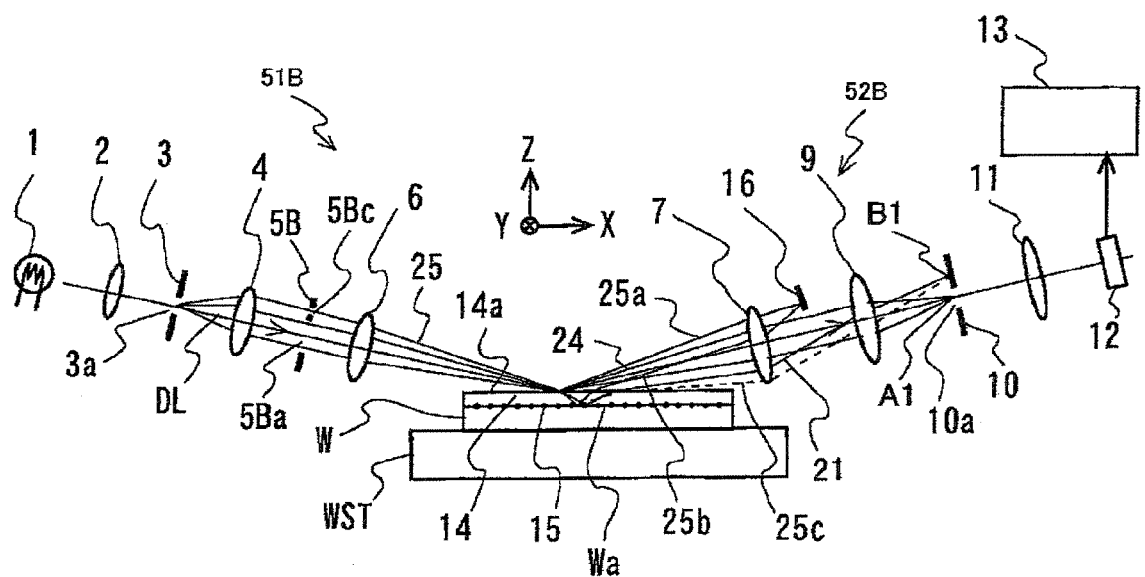
FIG. 4A is a drawing showing a configuration of an AF sensor in a modification example of the second embodiment.

A modification example of the present embodiment will be described below with reference to FIGS. 4A and 4B. In FIG. 4A in which the portions corresponding to those in FIG. 1A are denoted by the same reference symbols, the AF sensor is composed of a light sending system 51B, a light receiving system 52B, a light receiving system 12 and a signal processing system 13. The light sending system 51B is different from the light sending system 51A in FIG. 1A in that a sending-side stop 5B (aperture stop or phase plate) is installed instead of the sending-side stop 5, and the light receiving system 52B is different from the light receiving system 52A in FIG. 1A in that a receiving-side stop 16 (aperture stop) is installed instead of the phase difference plate 8. The other configuration is the same as the AF sensor in FIG. 1A.

Figure 4B:
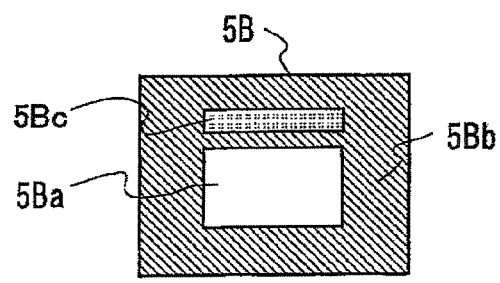
FIG. 4B a drawing showing a sending-side stop 5B in FIG. 4A.

The sending-side stop 5B in FIG. 4A has a structure, as shown in FIG. 4B, in which a first aperture 5Ba in the same shape as the aperture 5a of the sending-side stop 5 in FIG. 1B, and a rectangular second aperture 5Bc of a predetermined area above (in the +Z direction) and near it are provided in a shield portion 5Bb and in which a phase difference of about 180° ($\lambda/2$) is imparted between the detection light DL passing through the first aperture 5Ba and the detection light DL passing through the second aperture 5Bc. The receiving-side stop 16 is arranged at a position approximately conjugate with the sending-side stop 5B and is configured to block light passing through a region conjugate with the second aperture 5Bc of the sending-side stop 5B, and light passing through a region outside a region of a size of approximately three times the vertical and horizontal lengths of a region conjugate with the first aperture 5Ba. For example, the first aperture 5Ba has a function as a transparent portion which makes an incident light pass through it without shifting a phase (or with imparting a predetermined phase shift). The second aperture 5Bc has a function as a phase shifting portion which shifts a phase of light passing through it to about 180° in comparison with light passing through the first aperture 5Ba. The shield portion 5Bb has a function as a shield portion which blocks an incident light.

In this case, among the light 25 passing through the second aperture 5Bc of the sending-side stop 5B to impinge upon the resist surface 14a, in FIG. 4A, specular reflection light 25a specularly reflected on the resist surface 14a and specular reflection light 25b passing through the resist 14 to be specularly reflected on the underlying surface Wa (pattern 15) is incident in parallel into the light receiving system 52B and is blocked near the pupil plane of the light receiving system 52B by the receiving-side stop 16. Specular reflection light 21 passing through the resist 14 to be reflected on the underlying surface Wa (pattern 15) among the detection light DL passing through the first aperture 5Ba of the sending-side stop 5B to impinge upon the resist surface 14a, and diffracted light 25c diffracted on the underlying surface Wa (pattern 15) as indicated by a dashed line among the light 25 passing through the second aperture 5Bc to impinge upon the resist surface 14a, is focused at a position B1 on the receiving slit plate 10 by the light receiving system 52B. On this occasion, since the phases of the specular reflection light 21 and the diffracted light 25c are different about 180°, the light intensity at the position B1 becomes lowered, whereby the measurement of the Z-position of the resist surface 14a can be performed with high accuracy as in the embodiment of FIG. 1A.

The operational effects of the modification example shown in FIG. 4A are as follows.

(1) In the AF sensor of FIG. 4A, the optical system to impart the phase difference between different portions (for example, specular reflection light 21 and diffracted light 25c) in the light from the light receiving system 52B towards the light receiving slit plate 10 is composed of the sending-side stop 5B arranged at the pupil plane of the light sending system 51B or at the position near it in FIG. 4A and including the first and second apertures 5Ba, 5Bc in which the phases of light passing therethrough are different about 180°, and the receiving-side stop 16 arranged at the position approximately conjugate with the arrangement plane of the sending-side stop 5B by arranged at the pupil plane of the light receiving system 52B or at a position near it, in the light receiving system 52B and configured to block the light 25a, 25b specularly reflected on the resist surface 14a and on the underlying surface Wa after emitted from the second aperture 5Bc.

Therefore, in ordinary cases where the specular reflection light is strong and diffracted light is weak on the underlying surface Wa (pattern 15), the light intensity at the position B1 on the receiving slit plate 10 can be made approximately zero, by adjusting the ratio of the areas of the two apertures 5Ba, 5Bc of the sending-side stop 5B in FIG. 4B so that the intensity ratio of the specular reflection light 21 and the diffracted light 25c in FIG. 4A becomes approximately 1:1. Therefore, the Z-position of the resist surface 14a can be measured with high accuracy.

(2) In this modification example, the phase is imparted to the specular reflection light 21 on the pattern 15 formed on the underlying surface Wa, and the optical system to impart the phase includes the sending-side stop 5B (phase plate) arranged in the light sending system 51B and configured to impart the phase to the specular reflection light 21 and diffracted light 25c traveling toward the light receiving system 52B. This simplifies the configuration of the light receiving system 52B.

In FIG. 4B, the second aperture 5Bc is arranged on the +Z-direction side from the first aperture 5Ba, namely on the side of getting away from the resist surface 14a. By the second aperture 5Bc is arranged as described above, the light traveling through the second aperture 5Bc and entering to the resist surface 14a is able to enter to the resist surface 14a more perpendicularly. As a result, the light to be able to reach the underlying surface Wa can be increased and it becomes feasible to increase the light quantity of the diffracted light diffracted on the underlying surface Wa for by canceling each other. However, the position of the second aperture 5Bc to the first aperture 5Ba is not limited to the position shown in the present embodiment, and the second aperture 5Bc, for example, may be arranged on the side of getting closer to the resist surface 14a as long as the position of the receiving-side stop 16 is corresponded to the arrangement of the second aperture 5Bc.

Although the sending-side stop 5, 5A, 5B and the phase difference plate 8, 8A, 8B, 8C are transparent type elements in the present embodiment, at least one of elements in the phase difference imparting system may be a reflecting type element on which an incident light is reflected. In this case, a region functioning as a phase shifting portion, for example, may be a reflecting surface which imparts a predetermined phase difference (namely, a step) to a region functioning as a transparent portion.

Third Embodiment

The third embodiment of the present invention will be described below with reference to FIG. 5.

Figure 5:
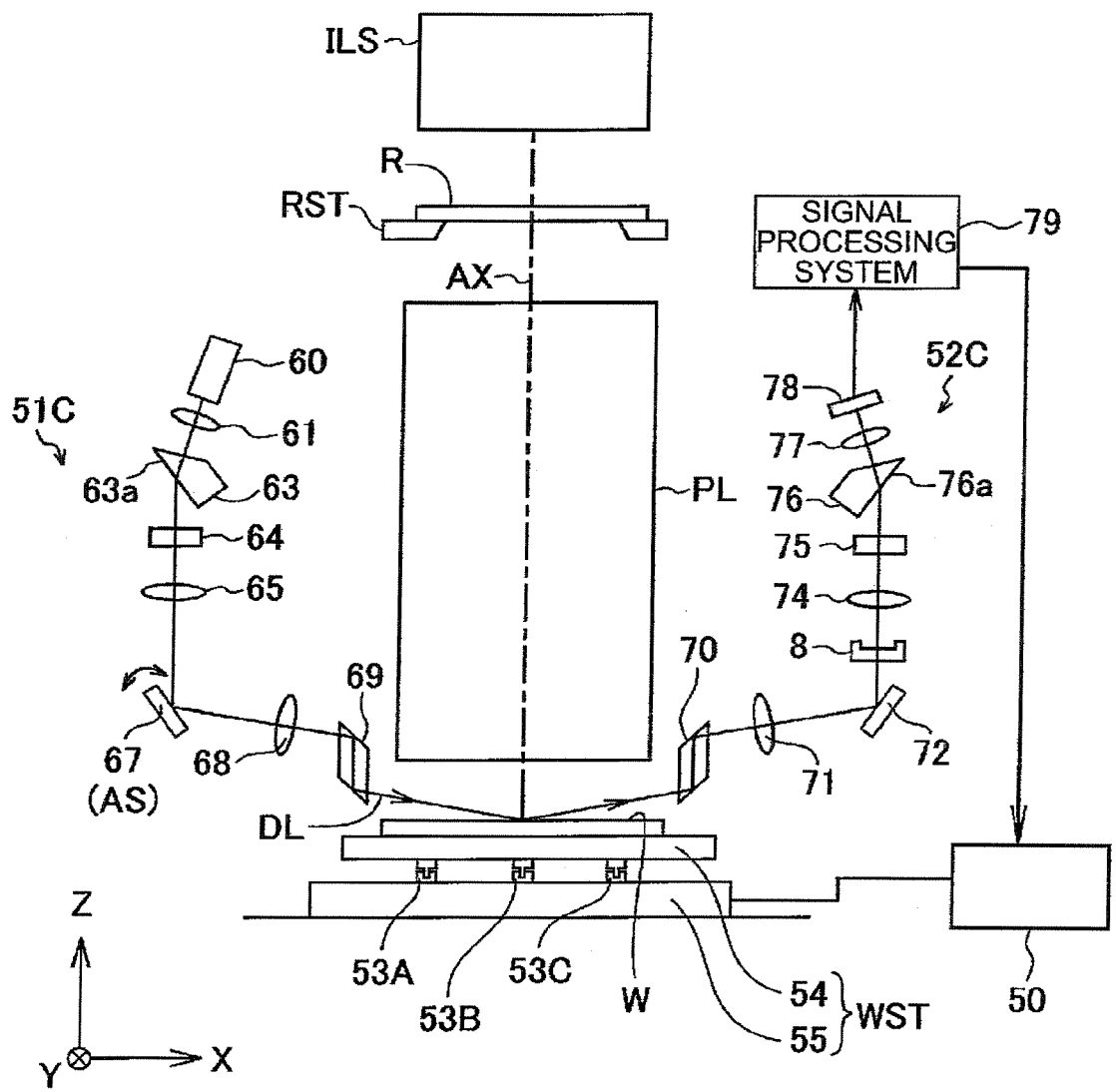
FIG. 5 is a drawing showing a schematic configuration of an exposure apparatus with an AF sensor in the third embodiment.

FIG. 5 is a drawing showing a schematic configuration of an exposure apparatus (projection exposure apparatus) of a scanning exposure type consisting of a scanning stepper of the present embodiment. In FIG. 5, the exposure apparatus has an exposure light source (not shown), an illumination optical system ILS to illuminate a reticle R (mask) with illumination light from the exposure light source, a reticle stage RST configured to move while holding the reticle R on an unrepresented reticle base, a projection optical system PL to project an image of a pattern on the reticle R onto a wafer W coated with a resist, a wafer stage WST configured to move on a guide plane defined by orthogonal X-axis and Y-axis, while holding the wafer W, and a main control system 50 consisting of a computer to control the operation of the whole apparatus. The wafer stage WST has an XY stage 55 to move in the X- and Y-directions on the guide plane, and a Z-leveling stage 54 mounted on the XY stage 55 through three Z-axis actuators 53A, 53B, 53C (voice coil motors or the like) that can control a drive amount in the Z-direction normal to the guide plane.

The exposure apparatus of the present embodiment is provided with an AF sensor for the wafer including a light sending system 51C, a light receiving system 52C, and a signal processing system 79, in order to measure the Z-position (focus position) of the resist surface on the wafer W at a plurality of measurement points in an exposure area by the projection optical system PL or in a measurement region near the exposure area.

In the light sending system 51C in FIG. 5, the detection light DL from the light source such as a halogen lamp or a light emitting diode (LED) not shown is guided through a lightguide 60. The detection light DL travels through a condenser lens 61 to illuminate a plurality of slits formed in an exit plane 63a of a sending slit prism 63. The detection light DL emitted from the exit plane 63a inclined relative to the optical axis of the sending slit prism 63, then travels via an electric herbing (rotatable plane-parallel plate) 64 to adjust positions of slit images, a second objective lens 65, a vibrating mirror 67 located approximately at the position of the pupil plane and also serving as an aperture stop AS, and a first objective lens 68 to enter a first prism 69 the shape of the side faces of which is a parallelogram. The light sending system 51C is composed of the components of from the lightguide 60 to the first prism 69. The detection light DL incident to the first prism 69 is sequentially reflected on two slant faces of the first prism 69 and travels along an optical path shifted below the optical path of the incident light, to be applied onto the measurement region on the wafer W from an oblique direction and form slit images at a plurality of measurement points in the measurement region.

In this case, the objective lenses 65 and 68 project the images of the slits in the exit plane 63a into the measurement region. Furthermore, because of vibration of the vibrating mirror 67 also corresponding to the sending-side stop 5 (aperture stop) in FIG. 1A, the slit images on the measurement region vibrate, for example, in a predetermined period in directions orthogonal to the longitudinal direction. The operations of the electric herbing 64 and vibrating mirror 67 are controlled by the signal processing system 79 operating according to a command from the main control system 50.

On the other hand, in the light receiving system 52C in FIG. 5, the detection light DL obliquely reflected from the wafer W is incident to a second prism 70 of a shape symmetric with the first prism 69, and thereafter is reflected on two slant faces thereof to be emitted in a state in which the optical path is shifted upward. The emitted detection light DL travels via a first objective lens 71, a mirror 72, a phase difference plate 8 which is the same as that in FIG. 1A, a second objective lens 74, and an electric herbing (rotatable plane-parallel plate) 75 to adjust positions of slit images, to enter an entrance plane 76a inclined relative to the optical axis of a receiving slit prism 76 and form a plurality of slit images. In the entrance plane 76a, a plurality of slits (receiving slits) are formed corresponding to the plurality of slits formed in the sending slit prism 63.

The detection light DL emitted from the receiving slit prism 76 then travels through a relay lens 77 to enter a light receiving sensor 78. The light receiving sensor 78 is provided with light receiving elements (photodiodes or the like) as many as the plurality of slits formed in the sending slit prism 63 (receiving slit prism 76) and beams passing through the corresponding receiving slits of the receiving slit prism 76 are focused on the respective light receiving elements. The light receiving system 52C is composed of the components of from the second prism 70 to the relay lens 77, and detected signals by the light receiving elements of the light receiving sensor 78 are supplied to the signal processing system 79. The signal processing system 79 synchronously detects the detected signals by the respective light receiving elements in synchronism with a drive signal of the vibrating mirror 67 and generates a focus signal corresponding to the Z-direction of each measurement point on the wafer W (e.g., a defocus amount with respect to the best focus plane of the projection optical system PL). Based on this focus signal, the main control system 50 drives the Z-leveling stage 54 so that the exposure area on the wafer W is brought into focus with the best focus plane.

In the present embodiment, use of the first prism 69 and the second prism 70 permits the detection light DL to be applied at a large angle of incidence to the measurement region in a state in which most of the optical systems of the light sending system 51C and the light receiving system 52C are arranged in the upper space. The operational effects of the present embodiment are as described below.

The exposure apparatus of the present embodiment in FIG. 5 is the exposure apparatus to perform exposure of the pattern (predetermined pattern) of the reticle R on the wafer W (photosensitive substrate), which comprises the AF sensor including the light sending system 51C and the light receiving system 52C basically in the same configuration as the AF sensor in FIG. 1A, in order to detect the Z-position (surface position information) of the resist surface on the wafer W.

The vibrating mirror 67 in FIG. 5 sets the angle of incidence of the detection light DL applied onto the wafer W as the sending-side stop 5 in FIG. 1A does, and the phase difference plate 8 in FIG. 5 imparts the phase difference of about 180° between specular reflection light and diffracted light from a pattern formed on the underlying surface as a bottom surface of a resist layer on the wafer W. Therefore, the intensity of the images formed on the entrance plane 76a of the receiving slit prism 76 is reduced by the reflected light from the underlying surface of the wafer W, whereby the Z-position of the wafer W can be measured with high accuracy. For this reason, the exposure area on the wafer W can be brought into focus with the best focus plane with high accuracy and the pattern of the reticle R can be transferred in a high resolution into each shot area on the wafer W.

Figure 6:
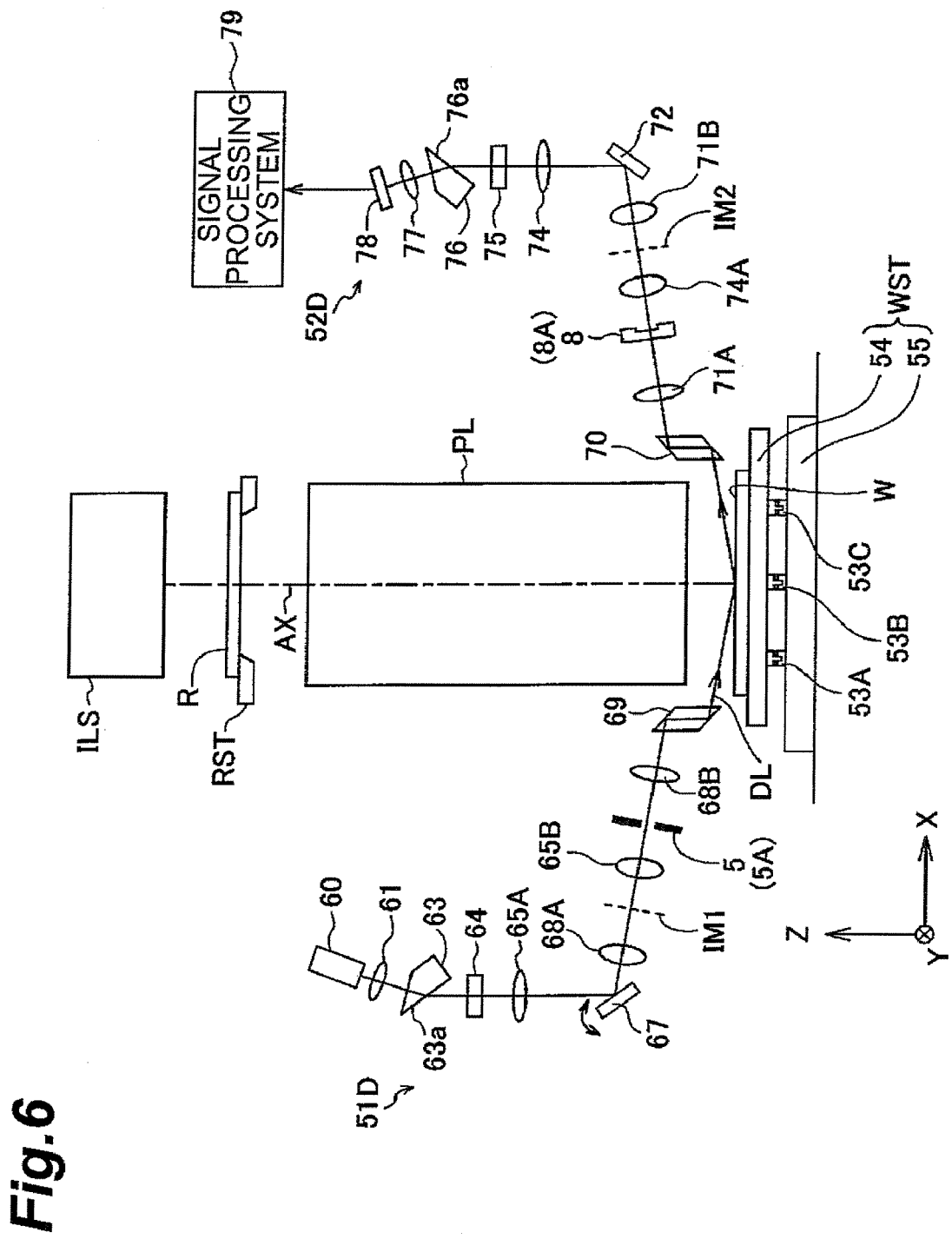
FIG. 6 is a drawing showing a modification example of the embodiment of FIG. 5.

As a modification example of the embodiment of FIG. 5, as shown in FIG. 6, a light sending system 51D of the AF sensor may be configured to form a plane approximately conjugate with an arrangement plane of an aperture stop. This is substantially equivalent to a configuration wherein an intermediate focus plane of the pattern projected onto the wafer W (target surface) is provided in the light sending system 51D.

In FIG. 6 in which the portions corresponding to those in FIG. 5 are denoted by the same reference symbols, the detection light DL from the slits in the exit plane 63a in the light sending system 51D travels via a fourth objective lens 65A, the vibrating mirror 67, and a third objective lens 68A to form slit images on an intermediate image plane IM1. The detection light DL from the intermediate image plane IM1 then travels via a second objective lens 65B, the same sending-side stop 5 as in FIG. 1A, a first objective lens 68B, and the first prism 69 to obliquely project the slit images onto the wafer W. The sending-side stop 5 is arranged at the pupil plane of the light sending system 51D or at a position near it and the sending-side stop 5 is arranged at the position approximately conjugate with the vibrating mirror 67.

On the other hand, in the light receiving system 52D in FIG. 6, the detection light from the wafer W travels via the second prism 70, a first objective lens 71A, a phase difference plate 8, and a second objective lens 74A to form slit images on an intermediate image plane IM2. The detection light from the intermediate image plane IM2 travels via a third objective lens 71B, the mirror 72, the fourth objective lens 74B, and others to form a plurality of slit images on the entrance plane 76a of the receiving slit prism 76.

The operational effects and others of the modification example shown in FIG. 6 are as described below.

(1) The light sending system 51D of the AF sensor in FIG. 6 has the relay optical system consisting of the objective lenses 68A, 65B to form the plane approximately conjugate with the arrangement plane of the sending-side stop 5 (aperture stop), and the vibrating mirror 67 arranged on the approximately conjugate plane. Therefore, the sending-side stop 5 and the vibrating mirror 67 can be arranged without mechanical interference in the light sending system 51D. This permits the synchronous detection, with reduction in the intensity of the reflected light from the underlying surface of the wafer W, which further improves the measurement accuracy. That is to say, the relay optical system consisting of the objective lenses 68A, 65B forms a plane approximately conjugate with a pupil plane of the optical system consisting of the objective lenses 65B, 68B as an arrangement plane of the sending-side stop (aperture stop) 5 and the vibrating mirror 67 is arranged at the approximately conjugate plane.

(2) In cases where the pitch of the pattern on the underlying surface of the wafer W is large and where divergence angles of the diffracted light are small in FIG. 6, the sending-side stop 5 and the phase difference plate 8 may be replaced by the sending-side stop 5A in FIG. 3A and the phase difference plate 8A in FIG. 3B (or the phase difference plate 8B in FIG. 3C), respectively.

The above embodiments were described as the examples of the projection exposure apparatus of the step-and-scan method, but the present invention is also applicable to the AF sensor in the projection exposure apparatus of the step-and-repeat method. The present invention is also applicable to the AF sensor in liquid immersion type exposure apparatus, for example, as disclosed in International Publication WO99/49504.

Furthermore, the above embodiments can also be used in combination with the AF sensor configured to reduce errors due to reflecting surfaces as disclosed, for example, in International Publication WO2007/058151 and International Publication WO2006/007549.

The surface position detecting apparatus and exposure apparatus according to the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 7:
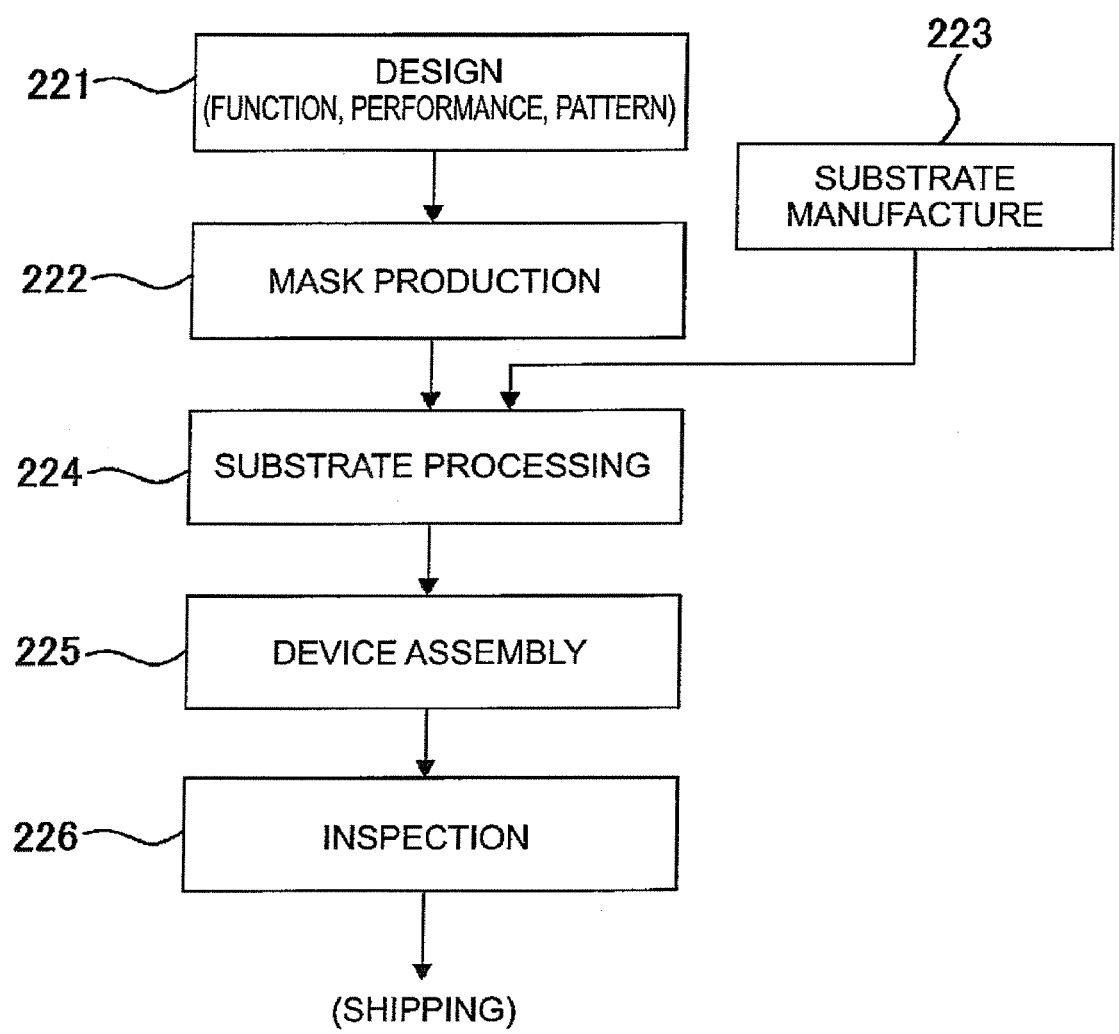
FIG. 7 is a flowchart showing an example of manufacturing steps of micro devices.

When micro devices such as semiconductor devices are manufactured using the exposure apparatus of the above embodiment, the micro devices are manufactured through the steps, as shown in FIG. 7, including step 221 of performing function and performance design of the micro devices, step 222 of producing a mask (reticle) based on the design step, step 223 of manufacturing a substrate (wafer) as a base material of the devices, substrate processing step 224 including a step of performing exposure of a pattern of the reticle on the substrate by the exposure apparatus (projection exposure apparatus) of the aforementioned embodiment, a step of developing the exposed substrate, heating (curing) and etching steps of the developed substrate, and so on, device assembly step (including a processing process of a dicing step, a bonding step, a packaging step, and so on) 225, an inspection step 226, and so on.

In other words, this device manufacturing method includes the exposure of the photosensitive substrate (wafer) by means of the exposure apparatus of the above embodiment, and the development of the exposed photosensitive substrate. At this time, since the measurement accuracy of the AF sensor for the photosensitive substrate (wafer) is improved, the exposure can be performed in a high resolution. Therefore, the devices with a microscopic pattern can be manufactured with high accuracy.

The present invention is not limited only to the application to the manufacturing processes of the semiconductor devices, but can also be widely applied, for example, to manufacturing processes of liquid-crystal display devices, plasma displays, and so on and to manufacturing processes of various devices such as imaging devices (CMOS type, CCDs, etc.), micromachines, MEMSs (Microelectromechanical Systems), thin-film magnetic heads, and DNA chips. As described above, the present invention does not have to be limited to the above embodiments and can be modified in many ways without departing from the scope and spirit of the invention.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. A surface position detecting apparatus which detects position information of a first surface in an object, comprising:
    a first optical system which projects, from an oblique direction to the first surface, light having traveled via a predetermined pattern onto the first surface;
    a second optical system which forms an image of the predetermined pattern, based on the light reflected by the first surface;
    a detecting system which detects the position information of the first surface in a direction intersecting the first surface, based on the light having traveled via the image of the predetermined pattern; and
    a phase difference imparting system which includes a phase shifting portion that is arranged within at least one of the first and second optical systems and on an optical path of the light and that changes a phase of at least a portion of the light, and which changes the phase of at least the portion of the light by the phase shifting portion so that a predetermined phase difference is imparted between a first portion and a second portion of reflected light that is included in the light having passed through the second optical system and that is reflected on a second surface in the object, the second surface being different from the first surface.

2. The surface position detecting apparatus according to claim 1, wherein the phase difference imparting system changes the phase of at least the portion of the light by the phase shifting portion so that a phase distribution of the reflected light, which is included in the light having passed through the phase difference imparting system and which is reflected by the first surface, is substantially identical to a phase distribution of the light not entering the phase difference imparting system.

3. The surface position detecting apparatus according to claim 1, wherein the phase difference imparting system includes a first region and a second region which respectively pass the first portion and the second portion of the reflected light that is reflected by the second surface therethrough, and at least a portion of the phase shifting portion is arranged on the first portion or the second portion.

4. The surface position detecting apparatus according to claim 1, wherein:
    the phase difference imparting system includes a first stop arranged within the first optical system and on the optical path of the light, and a second stop arranged within the second optical system and on the optical path of the light;
    the first stop includes a first transparent portion where the light passes through, and a shield portion which blocks the light;
    the second stop includes a second transparent portion where the light passes through, and a first phase shifting portion in the phase shifting portion;
    the second transparent portion has an identical shape with a conjugate image of the first transparent portion and is arranged at a position identical with the conjugate image; and
    the first shifting portion has an identical shape with a conjugate image of the shield portion and is arranged at a position identical with the conjugate image.

5. The surface position detecting apparatus according to claim 1, wherein:
    the phase difference imparting system includes a first stop arranged within the first optical system and on the optical path of the light, and a second stop arranged within the second optical system and on the optical path of the light;
    the first stop includes a first transparent portion where the light passes through, and a shield portion which blocks the light;
    the second stop includes a second transparent portion where the light passes through, and a second phase shifting portion in the phase shifting portion;
    the second transparent portion has an identical shape with a conjugate image of the shield portion and is arranged at a position identical with the conjugate image; and
    the first phase shifting portion has an identical shape with a conjugate image of the first transparent portion and is arranged at a position identical with the conjugate image.

6. The surface position detecting apparatus according to claim 1, wherein:
    the phase difference imparting system includes a first stop arranged within the first optical system and on the optical path of the light, and a second stop arranged within the second optical system and on the optical path of the light;
    the first stop includes a first phase shifting portion in the phase shifting portion, a first transparent portion where the light passes through, and a shield portion which blocks the light;
    the second stop includes a second transparent portion where the light passes through, and a second phase shifting portion in the phase shifting portion;
    the second transparent portion has an identical shape with a conjugate image of the first phase shifting portion and is arranged at a position identical with the conjugate image; and
    the second phase shifting portion has an identical shape with a conjugate image of the first transparent portion and is arranged at a position identical with the conjugate image.

7. The surface position detecting apparatus according to claim 6, wherein:
    the second stop further includes a third transparent portion where the light passes through; and
    the third transparent portion has an identical shape with a conjugate image of the first shield portion and is arranged at a position identical with the conjugate image.

8. The surface position detecting apparatus according to claim 6, wherein:
    the second stop further includes a second shield portion which blocks the light; and the second shield portion has an identical shape with a conjugate image of the first shield portion and is arranged at a position identical with the conjugate image.

9. The surface position detecting apparatus according to claim 1, wherein:
the phase difference imparting system includes a first stop arranged within the first optical system and on the optical path of the light, and a second stop arranged within the second optical system and on the optical path of the light;
the first stop includes a first phase shifting portion in the phase shifting portion, a first transparent portion where the light passes through, and a shield portion which blocks the light;
the second stop includes a second transparent portion where the light passes through, and a second phase shifting portion in the phase shifting portion;
the second transparent portion of the second stop has an identical shape with a conjugate image of the first transparent portion and is arranged at a position identical with the conjugate image; and
the second phase shifting portion has an identical shape with a conjugate image of the first phase shifting portion and is arranged at a position identical with the conjugate image.

10. The surface position detecting apparatus according to claim 9, wherein:
the second stop further includes a third phase shifting portion in the phase shifting portion; and
the third phase shifting portion has an identical shape with a conjugate image of the shield portion and is arranged at a position identical with the conjugate image.

11. The surface position detecting apparatus according to claim 1, wherein:
the phase difference imparting system includes a first stop arranged within the first optical system and on the optical path of the light, and a second stop arranged within the second optical system and on the optical path of the light;
the first stop includes a first transparent portion where the light passes through, and a first phase shifting portion in the phase shifting portion;
the second stop includes a second transparent portion where the light passes through, and a shield portion which blocks the light;
the second transparent portion has an identical shape with a conjugate image of the first transparent portion and is arranged at a position identical with the conjugate image; and
the shield portion has an identical shape with a conjugate image of the first phase shifting portion and is arranged at a position identical with the conjugate image.

12. The surface position detecting apparatus according to claim 1, wherein the predetermined phase difference is larger than 90° and smaller than 270°.

13. The surface position detecting apparatus according to claim 1, wherein:
the phase difference imparting system further includes an aperture stop arranged at a pupil plane of the first optical system or at a position near the pupil plane; and
the phase shifting portion includes a phase plate arranged within the second optical system and at a position approximately conjugate with an arrangement plane of the aperture stop, and shifting a phase of the light.

14. The surface position detecting apparatus according to claim 13, wherein the first optical system comprises a relay optical system to form, in the first optical system, a plane approximately conjugate with the arrangement plane of the aperture stop, and a vibrating mirror arranged on the approximately conjugate plane.

15. The surface position detecting apparatus according to claim 1, wherein:
the phase shifting portion includes:
a first phase plate which is arranged at a pupil plane of the first optical system or at a position near the pupil plane and which comprises a center region including an optical axis of the first optical system and a frame region outside the center region; and
a second phase plate which is arranged within the second optical system and at a position approximately conjugate with an arrangement plane of the first phase plate;
the first phase plate shifts the phase of at least the portion of the light so that a phase difference, imparted between the light having passed through the center region and the light having passed through the frame region, is approximately 180°; and
the second phase plate has phases identical with or reverse to those of the first phase plate.

16. The surface position detecting apparatus according to claim 1, wherein the phase difference imparting system includes:
a first aperture stop which is arranged at a pupil plane of the first optical system or at a position near the pupil plane and which includes first and second regions configured to impart an approximately 180° phase difference between light having passed through the first region and light having passed through the second region; and
a second aperture stop which is arranged within the second optical system and at a position approximately conjugate with an arrangement plane of the first aperture stop, and which blocks light having traveled from the second region to the first surface and specularly reflected by the first surface and on the second surface respectively.

17. The surface position detecting apparatus according to claim 1, wherein the phase difference imparting system changes the phase of at least the portion of the light by the phase shifting portion so that a predetermined phase difference is imparted between a first portion and a second portion of light that is included in the reflected light reflected by the second surface and that is incident on the second optical system after being specularly reflected and diffracted on the second surface.

18. The surface position detecting apparatus according to claim 17, wherein:
the object comprises a substrate and a coating applied on an upper surface of the substrate;
the first surface is a surface of the coating; and
the light reflected by the second surface contains diffracted light by a pattern formed on the upper surface of the substrate.

19. The surface position detecting apparatus according to claim 18, wherein the light reflected by the second surface contains light specularly reflected by the pattern formed on the upper surface of the substrate.

20. A surface position detecting apparatus which detects position information of a target surface located on a plane crossing a detection direction, comprising:
a light sending system to project an image of a predetermined pattern from an oblique direction onto the target surface, based on light having traveled via the predetermined pattern;

a light receiving system to re-form the image of the predetermined pattern, based on the light reflected by the target surface;

a detector to detect the position information in the detection direction of the target surface, based on the image of the predetermined pattern re-formed by the light receiving system; and a phase difference imparting system which includes a phase shifting portion that is arranged within at least one of the light sending system and the light receiving system and on an optical path of the light and that changes a phase of at least a portion of the light, and which changes the phase of at least the portion of the light by the phase shifting portion so that a predetermined phase difference is imparted between a first portion and a second portion of reflected light that is included in the light having passed through the light sending system and the light receiving system and that is reflected by a surface in the object, the surface being located at a position near the target surface.

21. A surface position detecting method of detecting position information of a first surface in an object, comprising:

projecting, from an oblique direction to the first surface, light having traveled via a predetermined pattern onto the first surface, through a first optical system;

forming an image of the predetermined pattern through the second optical system, based on the light reflected by the first surface;

detecting position information of the first surface in a direction intersecting the first surface, based on the light having traveled via the image of the predetermined pattern; and changing a phase of at least a portion of the light by a phase shifting portion that is arranged within at least one of the first and second optical systems and on an optical path of the light so that a predetermined phase difference is imparted between a first portion and a second portion of reflected light that is included in the light having passed through the second optical system and that is reflected on a second surface in the object, the second surface being different from the first surface.

22. The surface position detecting method according to claim 21, wherein the phase of at least the portion of the light is changed by the phase shifting portion so that a phase distribution of the reflected light, which is included in the light having passed through the second optical system and which is reflected by the first surface, is substantially identical to a phase distribution of the light upstream to the phase shifting portion.

23. An exposure apparatus which performs exposure of a pattern on a photosensitive substrate, the exposure apparatus comprising:

a substrate holding apparatus which holds the photosensitive substrate; and a surface position detecting apparatus for detecting surface position information of the photosensitive substrate which is held by the substrate holding apparatus, the surface position detecting apparatus comprising:

a first optical system which projects, from an oblique direction to a first surface of the photosensitive substrate, light having traveled via a predetermined pattern onto the first surface;

a second optical system which forms an image of the predetermined pattern, based on the light reflected by the first surface;

a detecting system-which detects the position information of the first surface in a direction intersecting the first surface, based on the light having traveled via the image of the predetermined pattern; and a phase difference imparting system which includes a phase shifting portion that is arranged-within at least one of the first and second optical systems and on an optical path of the light and that changes a phase of at least a portion of the light, and which changes the phase of at least the portion of the light by the phase shifting portion so that a predetermined phase difference is imparted between a first portion and a second portion of reflected light that is included in the light having passed through the second optical system and that is reflected on a second surface of the photosensitive substrate, the second surface being different from the first surface.

24. A device manufacturing method, comprising:

exposing a pattern on a photosensitive substrate, using an exposure apparatus, the exposure apparatus comprising:

a substrate holding apparatus which holds the photosensitive substrate; and the surface position detecting apparatus-for detecting surface position information of the photosensitive substrate which is held by the substrate holding apparatus, the surface position detecting apparatus comprising:

a first optical system which projects, from an oblique direction to a first surface of the photosensitive substrate, light having traveled via a predetermined pattern onto the first surface;

a second optical system which forms an image of the predetermined pattern, based on the light reflected by the first surface;

a detecting system-which detects the position information of the first surface in a direction intersecting the first surface, based on the light having traveled via the image of the predetermined pattern; and a phase difference imparting system which includes a phase shifting portion that is arranged-within at least one of the first and second optical systems and on an optical path of the light and that changes a phase of at least a portion of the light, and which changes the phase of at least the portion of the tight by the phase shifting portion so that a predetermined phase difference is imparted between a first portion and a second portion of reflected light that is included in the light having passed through the second optical system and that is reflected on a second surface of the photosensitive substrate, the second surface being different from the first surface; and developing the photosensitive substrate exposed with the pattern.

* * * * *

UNITED STATES PATENT AND TRADEMARK OFFICE
CERTIFICATE OF CORRECTION

PATENT NO. : 8,111,406 B2  
APPLICATION NO. : 12/265572  
DATED : February 7, 2012  
INVENTOR(S) : Hidaka Page 1 of 1

It is certified that error appears in the above-identified patent and that said Letters Patent is hereby corrected as shown below:

Title page, item 57, line 5, "system which receive" should read -- system which receives --.

In the Claims:

Claim 23, col. 30, line 4, "system-which detects" should read -- system which detects --.

Claim 23, col. 30, line 9, "arranged-within" should read -- arranged within --.

Claim 24, col. 30, line 45, "arranged-within" should read -- arranged within --.

Claim 24, col. 30, line 49, "tight" should read -- light --.

Signed and Sealed this  
Fourth Day of June, 2013

Teresa Stanek Rea  
*Acting Director of the United States Patent and Trademark Office*